United States Patent
Huang et al.

(10) Patent No.: US 11,854,903 B2
(45) Date of Patent: Dec. 26, 2023

(54) FOOTING REMOVAL IN CUT-METAL PROCESS

(71) Applicant: Taiwan Semiconductor Manufacturing Co., Ltd., Hsinchu (TW)

(72) Inventors: Ming-Chi Huang, Zhubei (TW); Kuo-Bin Huang, Jhubei (TW); Ying-Liang Chuang, Zhubei (TW); Ming-Hsi Yeh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 143 days.

(21) Appl. No.: 17/073,784

(22) Filed: Oct. 19, 2020

(65) Prior Publication Data

US 2021/0057287 A1 Feb. 25, 2021

Related U.S. Application Data

(63) Continuation of application No. 15/966,437, filed on Apr. 30, 2018, now Pat. No. 10,811,320.
(Continued)

(51) Int. Cl.
*H01L 29/66* (2006.01)
*H01L 29/78* (2006.01)
(Continued)

(52) U.S. Cl.
CPC ............... *H01L 21/823481* (2013.01); *H01L 21/32134* (2013.01); *H01L 21/32135* (2013.01); *H01L 21/32136* (2013.01); *H01L 21/823437* (2013.01); *H01L 21/823821* (2013.01); *H01L 21/823828* (2013.01); *H01L 21/823864* (2013.01); *H01L 21/823878* (2013.01);
(Continued)

(58) Field of Classification Search
CPC ..... H01L 21/823481; H01L 21/823878; H01L 21/823821; H01L 21/762; H01L 29/0649; H01L 27/0886
See application file for complete search history.

(56) References Cited

U.S. PATENT DOCUMENTS 5,436,205 A 7/1995 Hirose
6,433,871 B1 8/2002 Lensing et al.
(Continued)

FOREIGN PATENT DOCUMENTS

CN 104051266 A 9/2014
CN 106898610 A 6/2017
(Continued)

*Primary Examiner* — Sophia T Nguyen
(74) *Attorney, Agent, or Firm* — Slater Matsil, LLP

(57) ABSTRACT

A method includes forming a gate stack, which includes a first portion over a portion of a first semiconductor fin, a second portion over a portion of a second semiconductor fin, and a third portion connecting the first portion to the second portion. An anisotropic etching is performed on the third portion of the gate stack to form an opening between the first portion and the second portion. A footing portion of the third portion remains after the anisotropic etching. The method further includes performing an isotropic etching to remove a metal gate portion of the footing portion, and filling the opening with a dielectric material.

20 Claims, 28 Drawing Sheets

Related U.S. Application Data

(60) Provisional application No. 62/565,532, filed on Sep. 29, 2017.

(51) Int. Cl.
  *H01L 27/092* (2006.01)
  *H01L 21/8234* (2006.01)
  *H01L 21/8238* (2006.01)
  *H01L 21/3213* (2006.01)
  *H01L 21/311* (2006.01)

(52) U.S. Cl.
  CPC .. *H01L 29/66545* (2013.01); *H01L 29/66795* (2013.01); *H01L 29/7854* (2013.01); *H01L 21/31133* (2013.01); *H01L 27/0924* (2013.01)

(56) References Cited

U.S. PATENT DOCUMENTS

| | | | |
|---|---|---|---|
| 6,835,612 B2 | 12/2004 | Cappellani et al. | |
| 6,838,777 B2 | 1/2005 | Igarashi | |
| 7,939,895 B2 | 5/2011 | Fukasaku | |
| 8,076,735 B2 | 12/2011 | Lin | |
| 8,629,512 B2* | 1/2014 | Liaw | H01L 29/66795 |
| | | | 257/E29.264 |
| 9,041,125 B2* | 5/2015 | Lin | H01L 29/4238 |
| | | | 257/E21.621 |
| 9,064,932 B1* | 6/2015 | Pham | H01L 29/42316 |
| 9,331,074 B1* | 5/2016 | Chang | H01L 29/517 |
| 9,373,641 B2 | 6/2016 | Anderson et al. | |
| 9,418,994 B1 | 8/2016 | Chao et al. | |
| 9,460,968 B2 | 10/2016 | Lin et al. | |
| 9,461,043 B1* | 10/2016 | Chang | H01L 29/7848 |
| 9,520,482 B1 | 12/2016 | Chang et al. | |
| 9,553,090 B2* | 1/2017 | Chang | H01L 29/517 |
| 9,570,571 B1 | 2/2017 | Basker et al. | |
| 9,601,567 B1 | 3/2017 | Hsieh | |
| 9,741,854 B2* | 8/2017 | Bai | H01L 27/1211 |
| 9,773,912 B2* | 9/2017 | Chang | H01L 29/66795 |
| 9,786,564 B2* | 10/2017 | Chang | H01L 29/66477 |
| 9,899,267 B1* | 2/2018 | Liou | H01L 21/823481 |
| 9,899,271 B2* | 2/2018 | Chang | H01L 21/823814 |
| 9,972,495 B1* | 5/2018 | Wu | H01L 21/823437 |
| 10,014,298 B1* | 7/2018 | Zang | H01L 21/823878 |
| 10,050,128 B2 | 8/2018 | Chang et al. | |
| 10,056,469 B1* | 8/2018 | Li | H01L 21/31056 |
| 10,083,874 B1* | 9/2018 | Yu | H01L 29/66545 |
| 10,090,169 B1 | 10/2018 | Zang et al. | |
| 10,096,712 B2 | 10/2018 | Chen et al. | |
| 10,153,374 B2* | 12/2018 | Chang | H01L 29/785 |
| 10,177,240 B2* | 1/2019 | Greene | H01L 29/0649 |
| 10,199,279 B2 | 2/2019 | You et al. | |
| 10,283,503 B2* | 5/2019 | Huang | H01L 21/32139 |
| 10,424,588 B2 | 9/2019 | Yin et al. | |
| 10,553,592 B2* | 2/2020 | Zhou | H10B 10/12 |
| 10,748,898 B2* | 8/2020 | Huang | H01L 21/823878 |
| 10,811,320 B2* | 10/2020 | Huang | H01L 21/32135 |
| 10,868,189 B2* | 12/2020 | Chang | H01L 29/66545 |
| 10,872,890 B2 | 12/2020 | Chang et al. | |
| 10,930,749 B2* | 2/2021 | Jeon | H01L 29/42368 |
| 11,114,436 B2* | 9/2021 | Huang | H01L 21/32135 |
| 2002/0151183 A1 | 10/2002 | Yang et al. | |
| 2002/0182794 A1* | 12/2002 | Ning | H01L 28/40 |
| | | | 257/E21.582 |
| 2003/0186503 A1* | 10/2003 | Evans | H01L 21/823481 |
| | | | 257/E21.546 |
| 2003/0198898 A1 | 10/2003 | Lin et al. | |
| 2004/0203236 A1* | 10/2004 | Shim | H01L 21/31116 |
| | | | 438/719 |
| 2004/0207098 A1 | 10/2004 | Igarashi | |
| 2005/0083461 A1 | 4/2005 | Yang et al. | |
| 2005/0112879 A1* | 5/2005 | Fujimoto | H01L 21/31116 |
| | | | 257/E21.252 |
| 2005/0167762 A1* | 8/2005 | Kadoshima | H01L 29/665 |
| | | | 257/E21.194 |
| 2006/0017098 A1 | 1/2006 | Doczy et al. | |
| 2006/0081908 A1 | 4/2006 | Smayling | |
| 2006/0183060 A1* | 8/2006 | Perret | B82Y 10/00 |
| | | | 264/293 |
| 2007/0020777 A1 | 1/2007 | Tso et al. | |
| 2007/0082482 A1 | 4/2007 | Lee | |
| 2007/0128760 A1 | 6/2007 | Subramanian et al. | |
| 2008/0081441 A1 | 4/2008 | Tso et al. | |
| 2008/0149992 A1* | 6/2008 | Gidon | H01L 29/42332 |
| | | | 438/258 |
| 2008/0280424 A1 | 11/2008 | Yamazaki et al. | |
| 2009/0200636 A1 | 8/2009 | Edelstein et al. | |
| 2011/0237084 A1 | 9/2011 | Luong et al. | |
| 2012/0012946 A1 | 1/2012 | Yugami | |
| 2013/0037886 A1* | 2/2013 | Tsai | H01L 21/845 |
| | | | 438/231 |
| 2013/0087833 A1 | 4/2013 | Wang | |
| 2013/0217221 A1 | 8/2013 | Prindle et al. | |
| 2014/0151757 A1 | 6/2014 | Basu et al. | |
| 2014/0252486 A1* | 9/2014 | Lin | H01L 29/401 |
| | | | 257/365 |
| 2014/0319623 A1* | 10/2014 | Tsai | H01L 29/42364 |
| | | | 438/588 |
| 2015/0021710 A1* | 1/2015 | Hsu | H01L 21/823425 |
| | | | 257/401 |
| 2015/0054078 A1* | 2/2015 | Xie | H01L 27/0886 |
| | | | 257/288 |
| 2015/0069518 A1 | 3/2015 | Han | |
| 2015/0118818 A1 | 4/2015 | Yin et al. | |
| 2015/0228544 A1* | 8/2015 | Lin | H01L 27/0886 |
| | | | 257/288 |
| 2015/0228647 A1* | 8/2015 | Chang | H01L 21/823431 |
| | | | 438/596 |
| 2015/0236123 A1 | 8/2015 | Chang et al. | |
| 2015/0318279 A1 | 11/2015 | Hong | |
| 2015/0340461 A1 | 11/2015 | Wei et al. | |
| 2015/0348965 A1 | 12/2015 | Chang et al. | |
| 2016/0049483 A1 | 2/2016 | Zhang et al. | |
| 2016/0056181 A1* | 2/2016 | Anderson | H01L 21/823481 |
| | | | 438/157 |
| 2016/0079353 A1 | 3/2016 | Chen et al. | |
| 2016/0086946 A1 | 3/2016 | Yin et al. | |
| 2016/0126142 A1* | 5/2016 | Chen | H01L 21/28035 |
| | | | 438/585 |
| 2016/0133632 A1* | 5/2016 | Park | H01L 21/02164 |
| | | | 257/369 |
| 2016/0163604 A1* | 6/2016 | Xie | H01L 21/845 |
| | | | 438/430 |
| 2016/0181425 A1* | 6/2016 | Bai | H01L 27/1211 |
| | | | 438/283 |
| 2016/0204264 A1 | 7/2016 | You et al. | |
| 2016/0233094 A1* | 8/2016 | Anderson | H01L 27/0924 |
| 2016/0247728 A1 | 8/2016 | You et al. | |
| 2016/0247876 A1* | 8/2016 | Chung | H01L 21/823412 |
| 2016/0276340 A1* | 9/2016 | Chang | H01L 29/7848 |
| 2016/0307767 A1* | 10/2016 | Lee | H01L 21/845 |
| 2016/0336320 A1 | 11/2016 | Lin | |
| 2016/0351700 A1* | 12/2016 | Chang | H01L 29/66795 |
| 2016/0372378 A1* | 12/2016 | Chang | H01L 29/66795 |
| 2017/0005005 A1* | 1/2017 | Chen | H01L 27/0886 |
| 2017/0062325 A1 | 3/2017 | Greene et al. | |
| 2017/0110454 A1* | 4/2017 | Chang | H01L 29/495 |
| 2017/0110567 A1 | 4/2017 | Chen et al. | |
| 2017/0141210 A1 | 5/2017 | Yang | |
| 2017/0148682 A1* | 5/2017 | Basker | H01L 21/32133 |
| 2017/0154966 A1* | 6/2017 | Huang | H01L 29/41791 |
| 2017/0179117 A1* | 6/2017 | Chang | H01L 29/6656 |
| 2017/0213828 A1* | 7/2017 | Chang | H01L 29/66545 |
| 2017/0222020 A1 | 8/2017 | Yu et al. | |
| 2017/0222055 A1* | 8/2017 | Chang | H01L 29/66795 |
| 2017/0250282 A1 | 8/2017 | Wu et al. | |
| 2017/0256458 A1* | 9/2017 | Chang | H01L 29/42376 |
| 2017/0317185 A1 | 11/2017 | Cheng et al. | |
| 2017/0330801 A1* | 11/2017 | Ragnarsson | H01L 21/823842 |
| 2017/0338326 A1 | 11/2017 | Ching et al. | |
| 2017/0345820 A1* | 11/2017 | Lin | H01L 21/823437 |
| 2017/0365676 A1* | 12/2017 | Wu | H01L 29/66795 |
| 2017/0365705 A1* | 12/2017 | Yang | H01L 29/0649 |

(56) References Cited

U.S. PATENT DOCUMENTS

| | | |
|---|---|---|
| 2018/0033698 A1* | 2/2018 | Chang ............... H01L 29/66477 |
| 2018/0047754 A1 | 2/2018 | Basker et al. |
| 2018/0053829 A1* | 2/2018 | Smith .................. H01L 29/786 |
| 2018/0069000 A1 | 3/2018 | Bergendahl et al. |
| 2018/0108770 A1* | 4/2018 | Cheng ............... H01L 21/3085 |
| 2018/0204836 A1* | 7/2018 | Lin ................ H01L 21/823481 |
| 2018/0226259 A1 | 8/2018 | Choi et al. |
| 2018/0261514 A1* | 9/2018 | Xie ...................... H01L 29/785 |
| 2018/0261606 A1* | 9/2018 | Zhou .................. H01L 27/0924 |
| 2018/0308842 A1 | 10/2018 | Lee et al. |
| 2018/0315618 A1 | 11/2018 | Huang et al. |
| 2018/0323277 A1 | 11/2018 | Zhou |
| 2018/0337095 A1* | 11/2018 | Chen ............... H01L 21/823431 |
| 2019/0035786 A1* | 1/2019 | Huang ............ H01L 21/823821 |
| 2019/0067115 A1* | 2/2019 | Park .................... H01L 27/0924 |
| 2019/0103325 A1 | 4/2019 | Huang et al. |
| 2019/0131298 A1 | 5/2019 | Chen et al. |
| 2019/0131428 A1 | 5/2019 | Huang et al. |
| 2019/0139830 A1* | 5/2019 | Xie ..................... H01L 29/0649 |
| 2019/0139831 A1* | 5/2019 | Zhu .................. H01L 29/66795 |
| 2019/0164844 A1* | 5/2019 | Huang ............. H01L 21/02183 |
| 2019/0165137 A1 | 5/2019 | Chen et al. |
| 2019/0252268 A1* | 8/2019 | Xie ..................... H01L 29/4966 |
| 2019/0267374 A1 | 8/2019 | Hung et al. |
| 2019/0326282 A1* | 10/2019 | Huang ............ H01L 21/823431 |
| 2019/0341468 A1 | 11/2019 | Zang et al. |
| 2019/0371795 A1 | 12/2019 | Lin et al. |
| 2019/0393324 A1* | 12/2019 | Chen ............... H01L 21/823821 |
| 2020/0035674 A1* | 1/2020 | Lu .................... H01L 29/66795 |
| 2020/0044070 A1 | 2/2020 | Wang et al. |
| 2020/0105613 A1 | 4/2020 | Hung et al. |
| 2020/0227323 A1* | 7/2020 | Zang ................. H01L 21/76224 |
| 2020/0373298 A1* | 11/2020 | Huang ................ H01L 29/4966 |
| 2021/0050350 A1* | 2/2021 | Hung ............... H01L 21/823431 |
| 2021/0057287 A1* | 2/2021 | Huang ............ H01L 21/823864 |
| 2021/0118875 A1* | 4/2021 | Wu ..................... H01L 21/0228 |
| 2021/0226023 A1* | 7/2021 | Huang ............. H01L 21/02164 |
| 2021/0398975 A1* | 12/2021 | Huang ............ H01L 21/823437 |

FOREIGN PATENT DOCUMENTS

| | | |
|---|---|---|
| CN | 109326562 A | 2/2019 |
| KR | 20140111577 A | 9/2014 |
| KR | 20160102787 A | 8/2016 |

* cited by examiner

FOOTING REMOVAL IN CUT-METAL PROCESS

PRIORITY CLAIM AND CROSS-REFERENCE

This application is a continuation of U.S. patent application Ser. No. 15/966,437, entitled "Footing Removal in Cut-Metal Process," filed Apr. 30, 2018, which claims the benefit of the U.S. Provisional Application No. 62/565,532, filed Sep. 29, 2017, and entitled "Footing Removal in Cut-Metal Process," which applications are hereby incorporated herein by reference.

BACKGROUND

Metal-Oxide-Semiconductor (MOS) devices are basic building elements in integrated circuits. An existing MOS device typically has a gate electrode having polysilicon doped with p-type or n-type impurities, using doping operations such as ion implantation or thermal diffusion. The work function of the gate electrode was adjusted to the band-edge of the silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also referred to as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes or metal silicide gate electrodes, wherein the metallic gates used in NMOS devices and PMOS devices may also have band-edge work functions. Since the NMOS devices and PMOS devices have different requirements regarding the work functions, dual-gate CMOS devices are used.

In the formation of the metal gate electrodes, a long dummy gate is formed first, which is then etched, so that the portions of the long dummy gate are separated from each other. A dielectric material is then filled into the opening left by the etched portion of the long dummy gate. The dielectric material is then polished, leaving a portion of the dielectric material between the remaining portions of the dummy gate. The separated portions of the dummy gate are then replaced with metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 14A, 14B, 14C, and 14D illustrate the perspective view, top views, and cross-sectional views of intermediate stages in the formation of a Fin Field-Effect Transistor (FinFET) in accordance with some embodiments.

DETAILED DESCRIPTION

Figure 1:
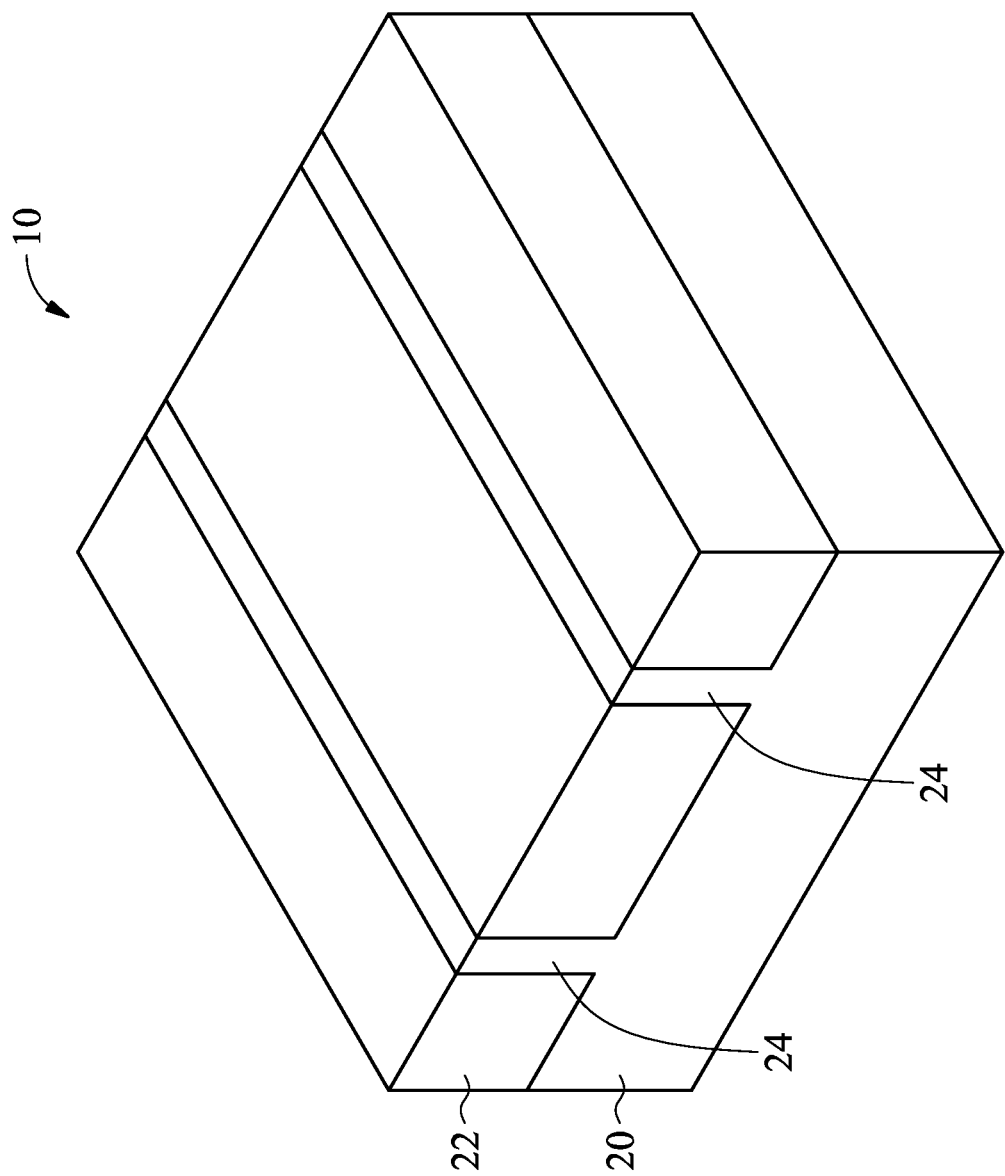

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors formed using cut-metal-gate process and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of Fin Field-Effect Transistors (FinFETs) is used as an example to explain the concept of the present disclosure. Planar transistors may also adopt the embodiments of the present disclosure.

FIGS. 1 through 14A illustrate the cross-sectional views and perspective views of intermediate stages in the formation of FinFETs in accordance with some embodiments of the present disclosure. The steps shown in FIGS. 1 through 14A are also reflected schematically in the process flow 200 as shown in FIG. 15.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some exemplary embodiments. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy to regrow another semiconductor material in the recesses. Accordingly, semiconductor strips 24 are formed of a semiconductor material different from that of substrate 20. In accordance with some exemplary embodiments, semiconductor strips 24 are formed of silicon germanium, silicon carbon, or a III-V compound semiconductor material.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

Figure 2:
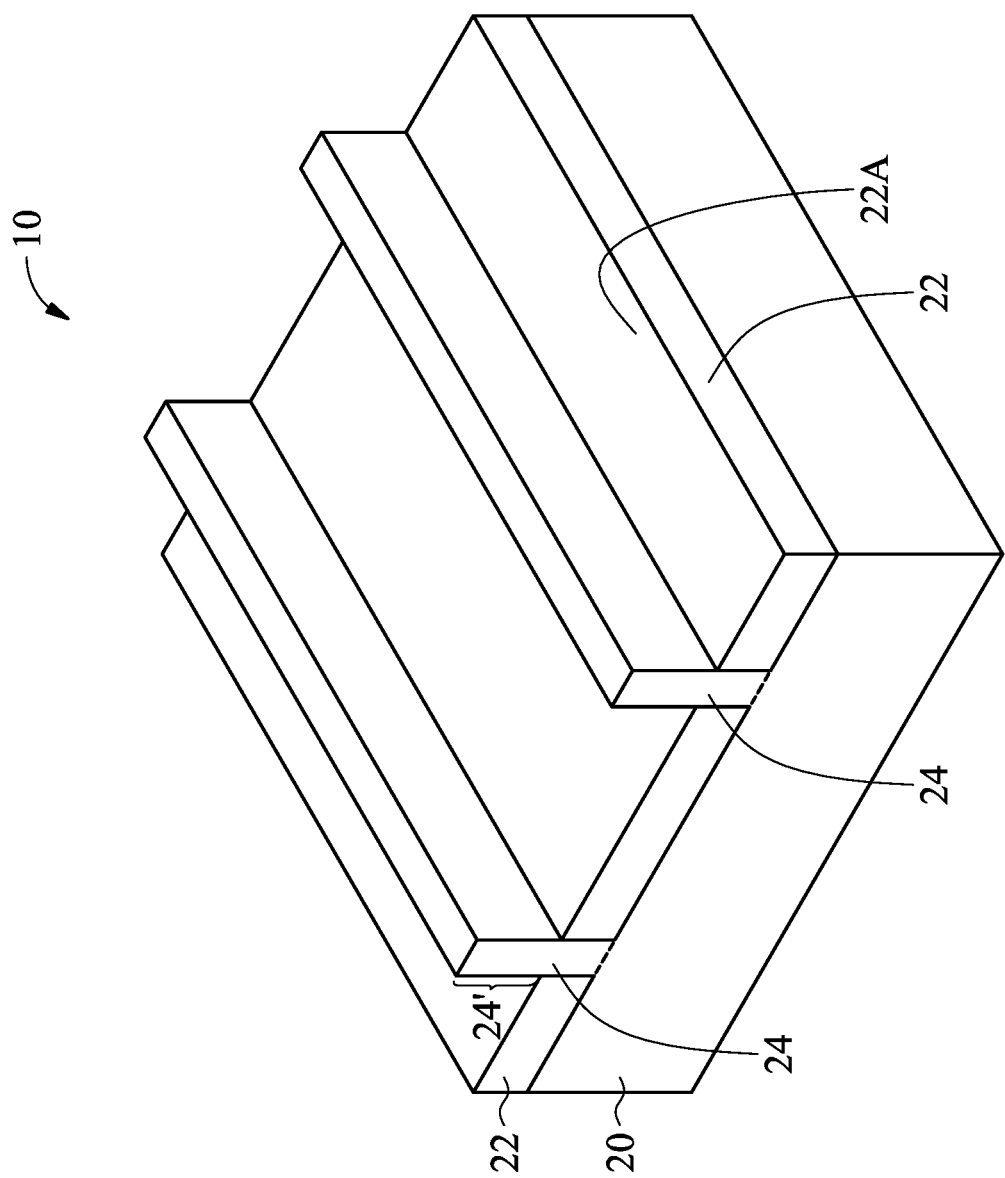

Referring to FIG. 2, STI regions 22 are recessed, so that the top portions of semiconductor strips 24 protrude higher than the top surfaces 22A of the remaining portions of STI regions 22 to form protruding fins 24'. The respective step is illustrated as step 202 in the process flow 200 as shown in FIG. 15. The etching may be performed using a dry etching process, wherein $HF_3$ and $NH_3$ are used as the etching gases. In accordance with alternative embodiments of the present disclosure, the recessing of STI regions 22 is performed using a wet etch process. The etching chemical may include HF solution, for example.

In above-illustrated exemplary embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The materials of protruding fins 24' may also be replaced with materials different from that of substrate 20. For example, protruding fins 24' may be formed of Si, SiP, SiC, SiPC, SiGe, SiGeB, Ge, or a III-V compound semiconductor such as InP, GaAs, AlAs, InAs, InAlAs, InGaAs, or the like.

Figure 3:
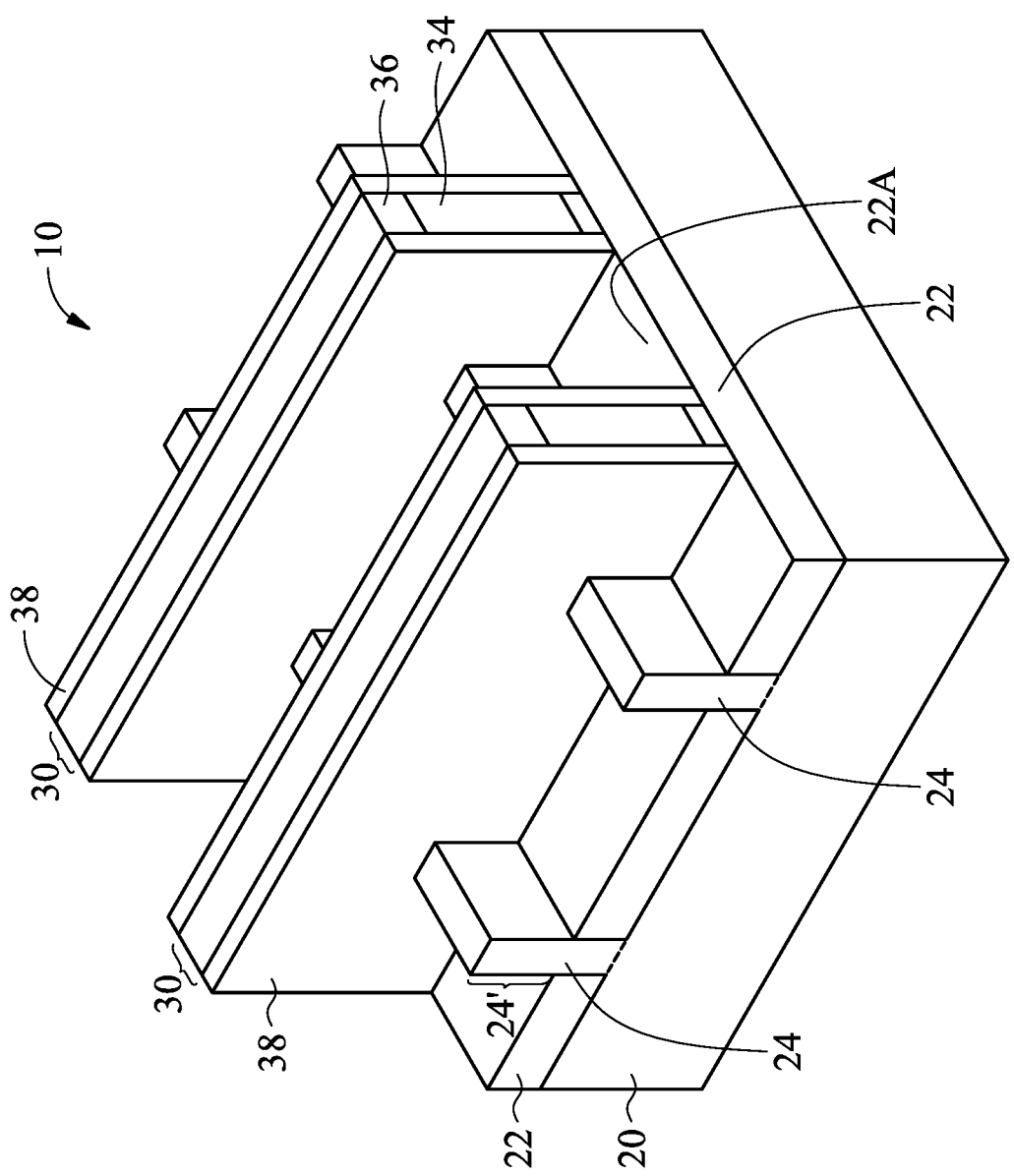

Referring to FIG. 3, dummy gate stacks 30 are formed on the top surfaces and the sidewalls of (protruding) fins 24'. The respective step is illustrated as step 204 in the process flow 200 as shown in FIG. 15. Dummy gate stacks 30 may include dummy gate dielectrics 32 and dummy gate electrodes 34 over dummy gate dielectrics 32. Dummy gate electrodes 34 may be formed, for example, using polysilicon, and other materials may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, or multi-layers thereof. Dummy gate stacks 30 may cross over a single one or a plurality of protruding fins 24' and/or STI regions 22. Dummy gate stacks 30 also have lengthwise directions perpendicular to the lengthwise directions of protruding fins 24'.

Next, gate spacers 38 are formed on the sidewalls of dummy gate stacks 30. In accordance with some embodiments of the present disclosure, gate spacers 38 are formed of a dielectric material such as silicon nitride, silicon oxide, silicon carbo-nitride, silicon oxynitride, silicon oxy carbonitride, or the like, and may have a single-layer structure or a multi-layer structure including a plurality of dielectric layers.

Figure 4:
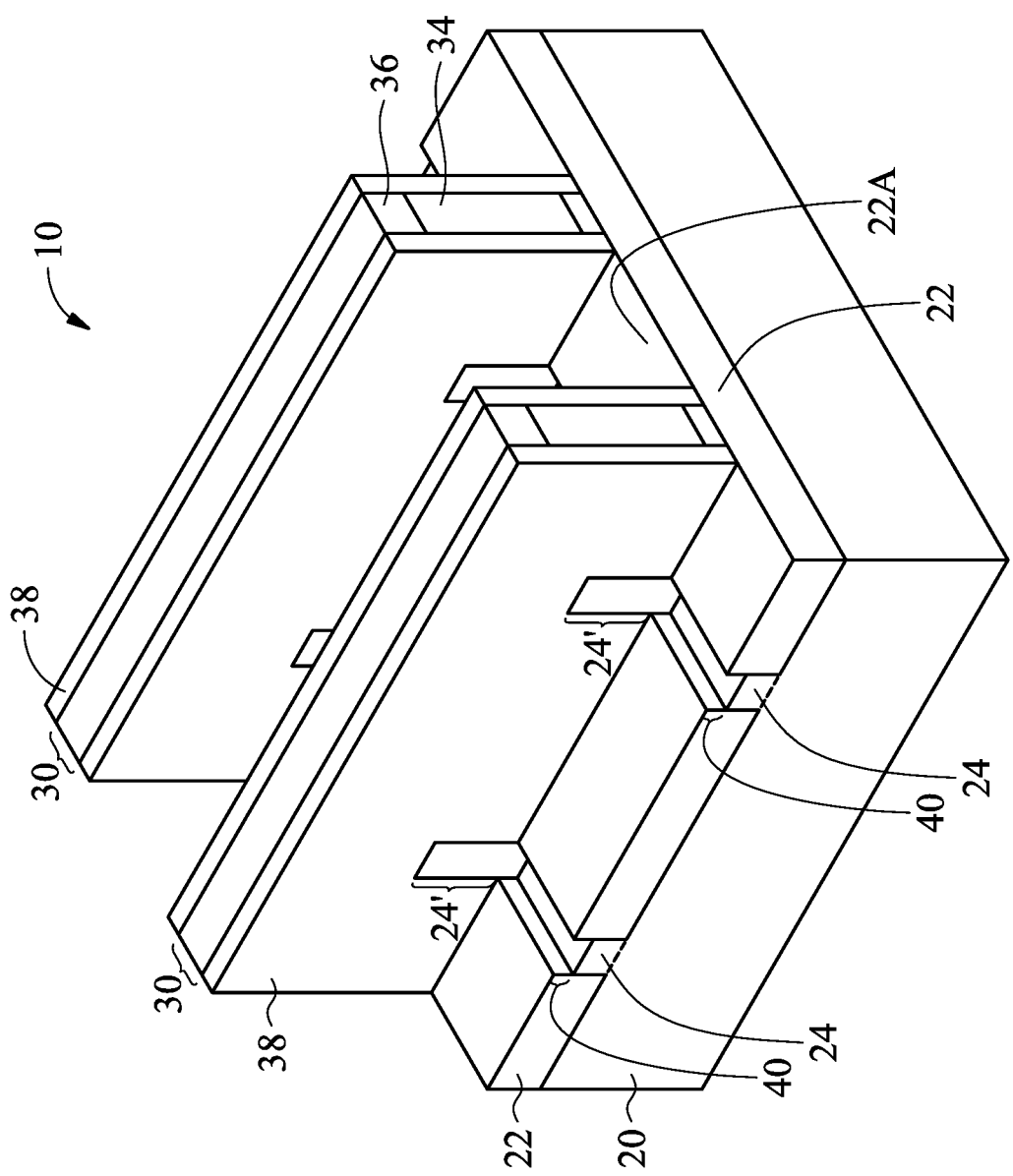

In accordance with some embodiments of the present disclosure, an etching step (referred to as source/drain recessing hereinafter) is performed to etch the portions of protruding fins 24' that are not covered by dummy gate stack 30 and gate spacers 38, resulting in the structure shown in FIG. 4. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. Recesses 40 are accordingly formed between STI regions 22. Recesses 40 are located on the opposite sides of dummy gate stacks 30.

Figure 5A:
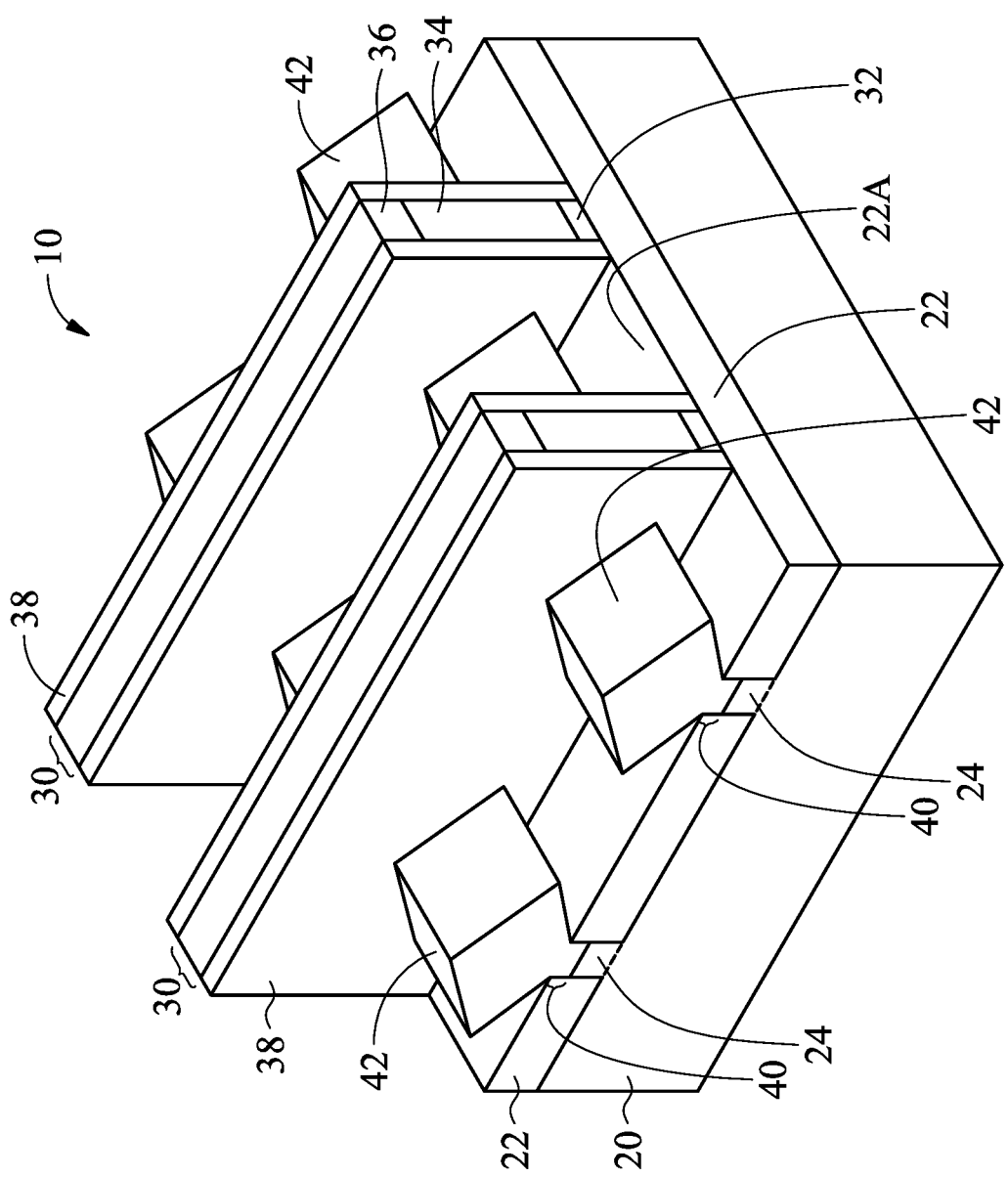

Next, epitaxy regions (source/drain regions) 42 are formed by selectively growing a semiconductor material in recesses 40, resulting in the structure in FIG. 5A. The respective step is illustrated as step 206 in the process flow 200 as shown in FIG. 15. In accordance with some exemplary embodiments, epitaxy regions 42 include silicon germanium, silicon, or silicon carbon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), GeB, or the like may be grown. Conversely, when the resulting FinFET is an n-type FinFET, silicon phosphorous (SiP), silicon carbon phosphorous (SiCP), or the like, may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed.

After the epitaxy step, epitaxy regions 42 may be further implanted with a p-type or an n-type impurity to form source and drain regions, which are also denoted using reference numeral 42. In accordance with alternative embodiments of the present disclosure, the implantation step is skipped when epitaxy regions 42 are in-situ doped with the p-type or n-type impurity during the epitaxy to form source/drain regions. Epitaxy source/drain regions 42 include lower portions that are formed in STI regions 22, and upper portions that are formed over the top surfaces of STI regions 22.

Figure 5B:
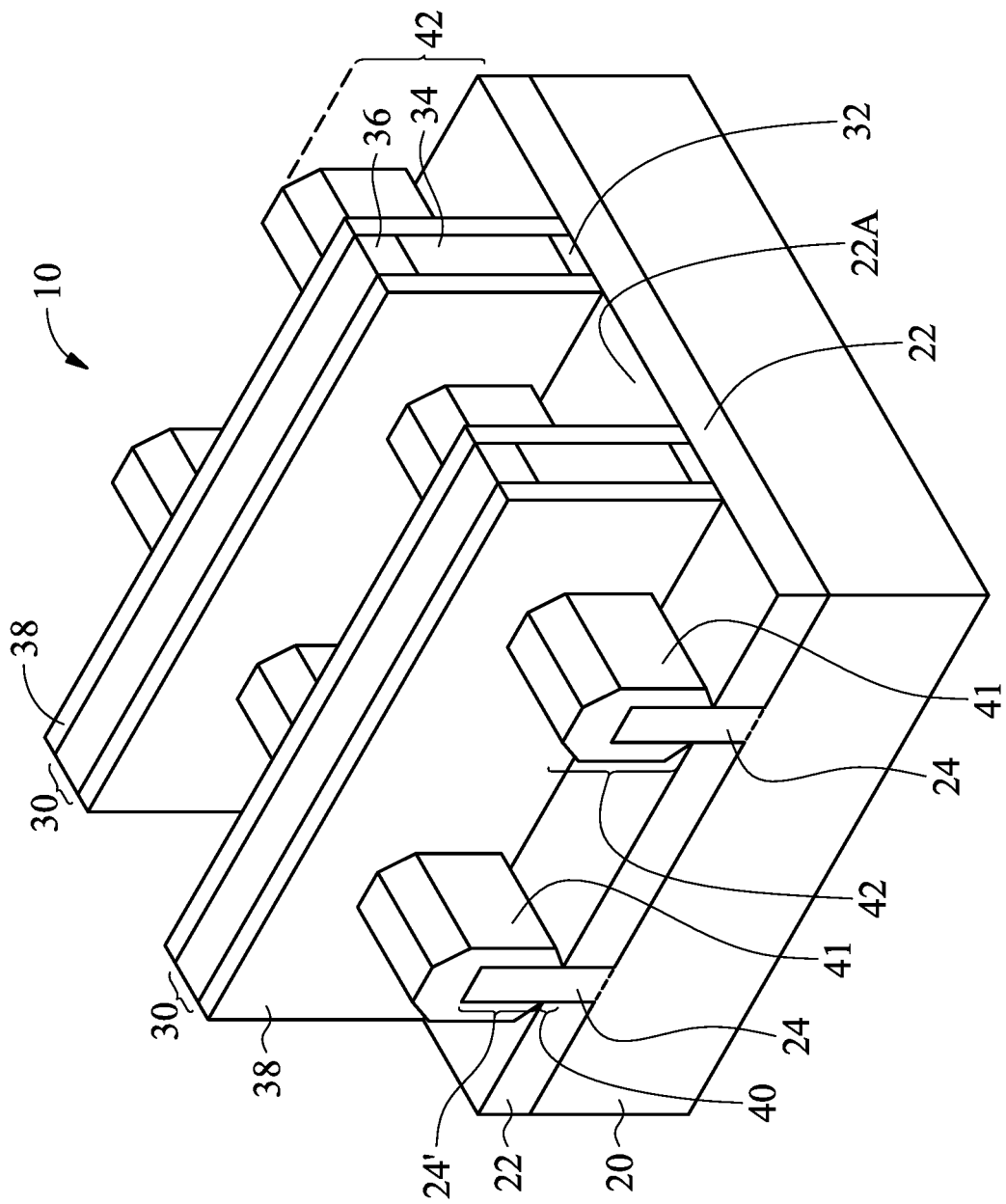

FIG. 5B illustrates the formation of cladding source/drain regions 42 in accordance with alternative embodiments of the present disclosure. In accordance with these embodiments, the protruding fins 24' as shown in FIG. 3 are not recessed, and epitaxy regions 41 are grown on protruding fins 24'. The material of epitaxy regions 41 may be similar to the material of the epitaxy semiconductor material 42 as shown in FIG. 5A, depending on whether the resulting FinFET is a p-type or an n-type FinFET. Accordingly, source/drains 42 include protruding fins 24' and the epitaxy region 41. An implantation may (or may not) be performed to implant an n-type impurity or a p-type impurity.

Figure 6A:
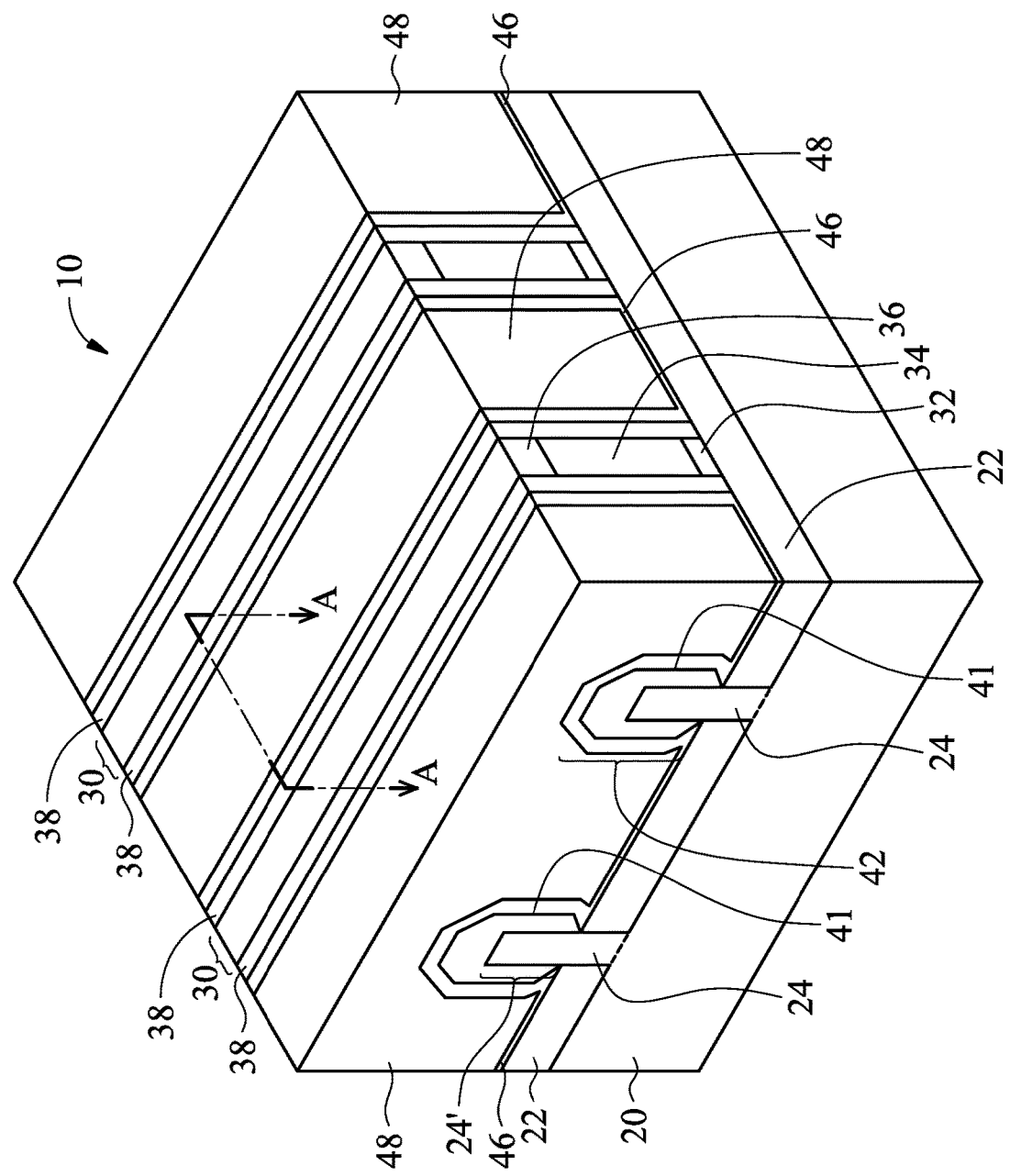

FIG. 6A illustrates a perspective view of the structure after the formation of Contact Etch Stop Layer (CESL) 46 and Inter-Layer Dielectric (ILD) 48. The respective step is illustrated as step 208 in the process flow 200 as shown in FIG. 15. CESL 46 may be formed of silicon nitride, silicon carbo-nitride, or the like. CESL 46 may be formed using a conformal deposition method such as ALD or CVD, for example. ILD 48 may include a dielectric material formed using, for example, FCVD, spin-on coating, CVD, or another deposition method. ILD 48 may also be formed of an oxygen-containing dielectric material, which may be silicon-oxide based such as Tetra Ethyl Ortho Silicate (TEOS) oxide, Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization step such as Chemical Mechanical Polish (CMP) or mechanical grinding is performed to level the top surfaces of ILD 48, dummy gate stacks 30, and gate spacers 38 with each other.

Figure 6B:
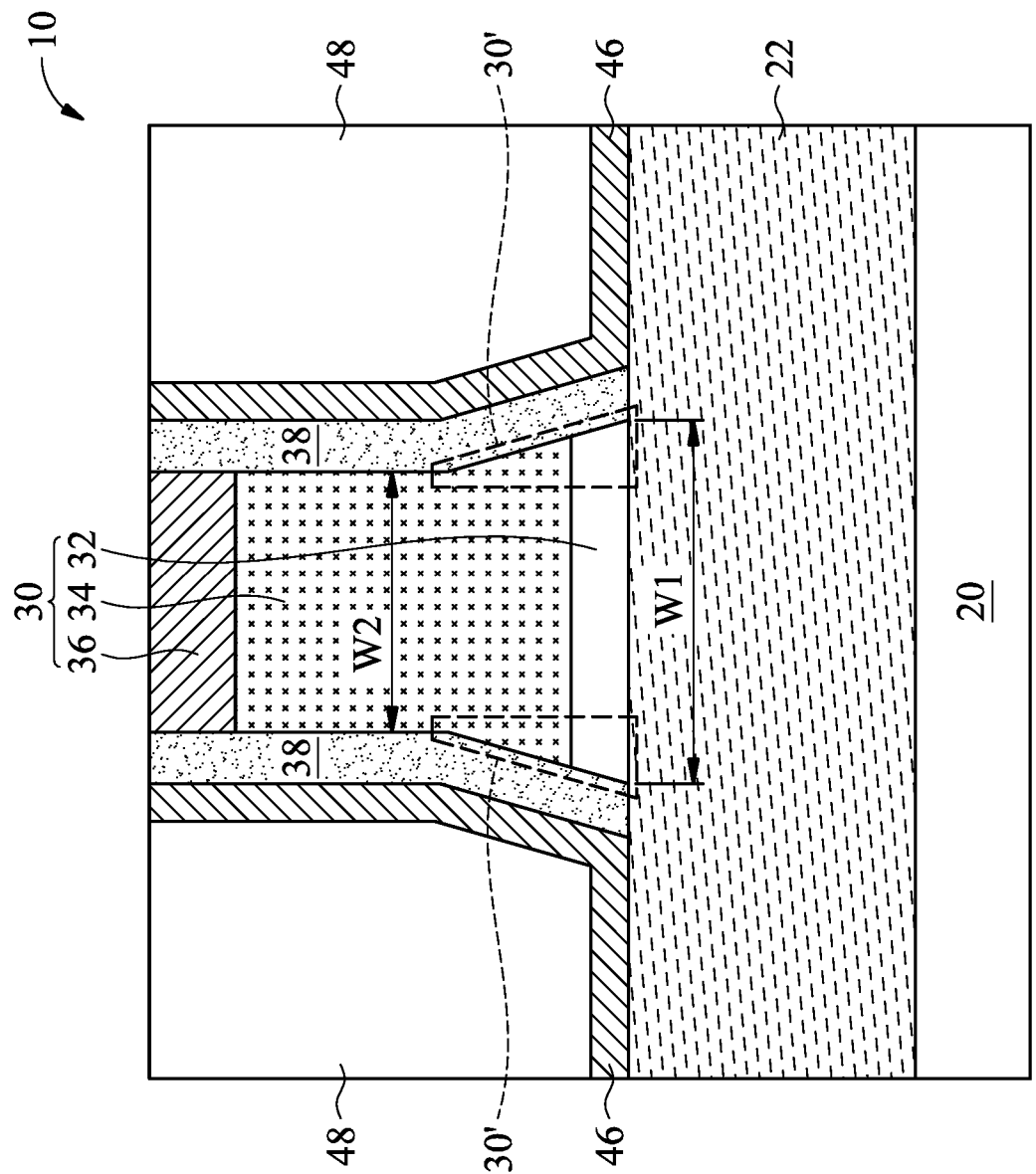

A cross-sectional view of the structure shown in FIG. 6A is illustrated in FIG. 6B. The cross-sectional view is obtained from the vertical plane containing line A-A in FIG. 6A. As shown in FIG. 6B, one of dummy gate stacks 30 is illustrated. Due to process reasons such as the etching effect in the formation of dummy gate stack 30, the bottom portions of dummy gate stack 30 are wider than the respective upper portions. In addition, it is possible that dummy gate stack 30 includes an upper portion with straight and vertical sidewalls, and a lower portion with slanted sidewalls. The slanted sidewalls may also be straight, or may be substantially straight with a slight curve. The widening in the bottom portion of dummy gate stack 30 is referred to as footing effect, and the widening portions are referred to as footing regions (or portions), as marked by portions 30'. Footing portions 30' are overlapped by portions of gate spacers 38. In accordance with some embodiments of the present disclosure, the difference between bottom width W1 and the width W2 of the top portion (that has the vertical edges) of gate stack 30 is greater than about 8 nm, and may be in the range between about 8 nm and about 12 nm. Gate spacers 38 may follow the profile of the sidewalls of dummy gate stack 30, and hence have slanted bottom portions.

Figure 7A:
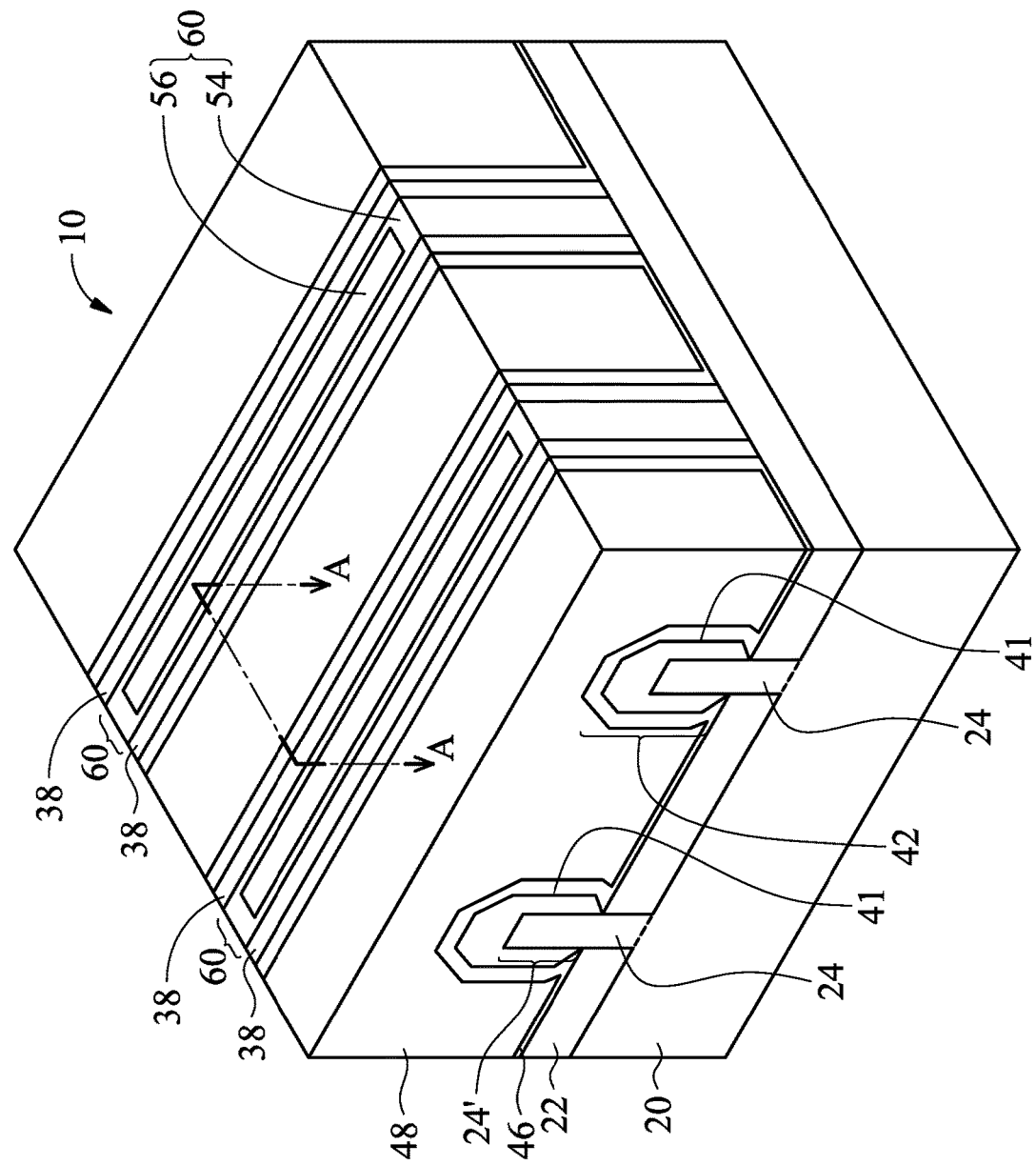
Figure 7B:
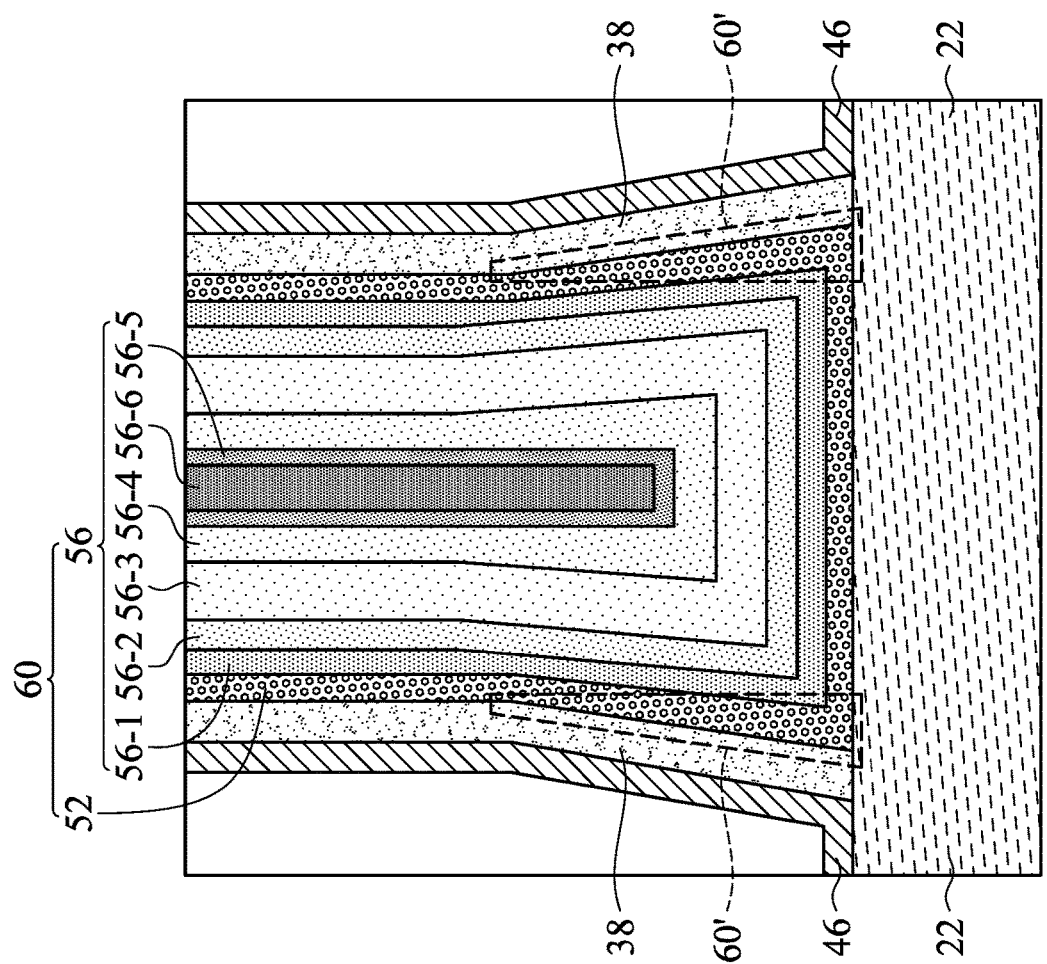

Next, dummy gate stacks 30, which include hard mask layers 36, dummy gate electrodes 34 and dummy gate dielectrics 32, are replaced with replacement gate stacks, which include metal gates and replacement gate dielectrics as shown in FIGS. 7A and 7B. In accordance with some embodiments of the present disclosure, the replacement includes etching hard mask layers 36, dummy gate electrodes 34, and dummy gate dielectrics 32 as shown in FIGS. 6A and 6B in one or a plurality of etching steps, resulting in openings to be formed between opposite portions of gate spacers 38. The respective step is illustrated as step 210 in the process flow 200 as shown in FIG. 15. The respective structure may be realized from the structure shown in FIG. 6A by removing dummy gate stacks 30.

Next, referring to FIGS. 7A and 7B, (replacement) gate stacks 60 are formed, which include gate dielectric layers 54 and gate electrode 56. The respective step is illustrated as step 212 in the process flow 200 as shown in FIG. 15. The formation of gate stacks 60 includes forming/depositing a plurality of layers, and then performing a planarization process such as a CMP process or a mechanical grinding process. Gate dielectric layers 54 extend into the trenches left by the removed dummy gate stacks. In accordance with some embodiments of the present disclosure, gate dielectric layers 54 include an Interfacial Layer (IL) 50 (FIG. 8C) as its lower part. IL 50 is formed on the exposed surfaces of protruding fins 24'. IL 50 may include an oxide layer such as a silicon oxide layer, which is formed through the thermal oxidation of protruding fins 24', a chemical oxidation process, or a deposition process. Gate dielectric layer 54 may also include high-k dielectric layer 52 (FIGS. 8B and 8C) formed over IL 50. High-k dielectric layer 52 includes a high-k dielectric material such as $HfO_2$, $ZrO_2$, HfZrOx, HfSiOx, HfSiON, ZrSiOx, HfZrSiOx, $Al_2O_3$, HfAlOx, HfAlN, ZrAlOx, $La_2O_3$, $TiO_2$, $Yb_2O_3$, silicon nitride, or the like. The dielectric constant (k-value) of the high-k dielectric material is higher than 3.9, and may be higher than about 7.0. High-k dielectric layer 52 is formed as a conformal layer, and extends on the sidewalls of protruding fins 24' and the sidewalls of gate spacers 38. In accordance with some embodiments of the present disclosure, high-k dielectric layer 52 is formed using ALD or CVD.

Referring back to FIGS. 7A and 7B, gate electrodes 56 are formed on top of gate dielectric layers 54, and fill the remaining portions of the trenches left by the removed dummy gate stacks. The sub-layers in gate electrodes 56 are not shown separately in FIG. 7A, while in reality, the sub-layers are distinguishable from each other due to the difference in their compositions. The deposition of at least lower sub-layers may be performed using conformal deposition methods such as ALD or CVD, so that the thickness of the vertical portions and the thickness of the horizontal portions of gate electrodes 56 (and each of sub-layers) are substantially equal to each other.

Gate electrodes 56 may include a plurality of layers including, and not limited to, a Titanium Silicon Nitride (TSN) layer, a tantalum nitride (TaN) layer, a titanium nitride (TiN) layer, a titanium aluminum (TiAl) layer, an additional TiN and/or TaN layer, and a filling metal. Some of these layers define the work function of the respective FinFET. Furthermore, the metal layers of a p-type FinFET and the metal layers of an n-type FinFET may be different from each other so that the work functions of the metal layers are suitable for the respective p-type or n-type FinFETs. The filling metal may include aluminum, copper, or cobalt.

FIG. 7B illustrates the cross-sectional view of an exemplary metal gate stack 60. The cross-sectional view is obtained from the vertical plane containing A-A as shown in FIG. 7A. Since the cross-sectional view is obtained from the plane crossing STI regions 22 rather than protruding fins 24', IL 50 is not present in the cross-sectional view. Rather, high-k dielectric layer 52 contacts the top surface of STI region 22. In accordance with some exemplary embodiment, gate electrode 56 includes TSN layer 56-1, TaN layer 56-2, TiN layer 56-3, TiAl layer 56-4, TiN layer 56-5, and filling metal 56-6. It is appreciated that this layer stack is an example, and metal stacks having different structures may be adopted. Gate stack 60 also includes footing portions 60', which are resulted due to the existence of footing regions 30' in dummy gate stacks 30 (FIG. 6B). It is shown that footing portions 60' include high-k dielectric layer 52 and possibly some metal layers such as TSN, TaN, and/or TiN layers. Footing portions 60' are directly underlying, and are overlapped by, portions of gate spacers 38.

Figure 8A:
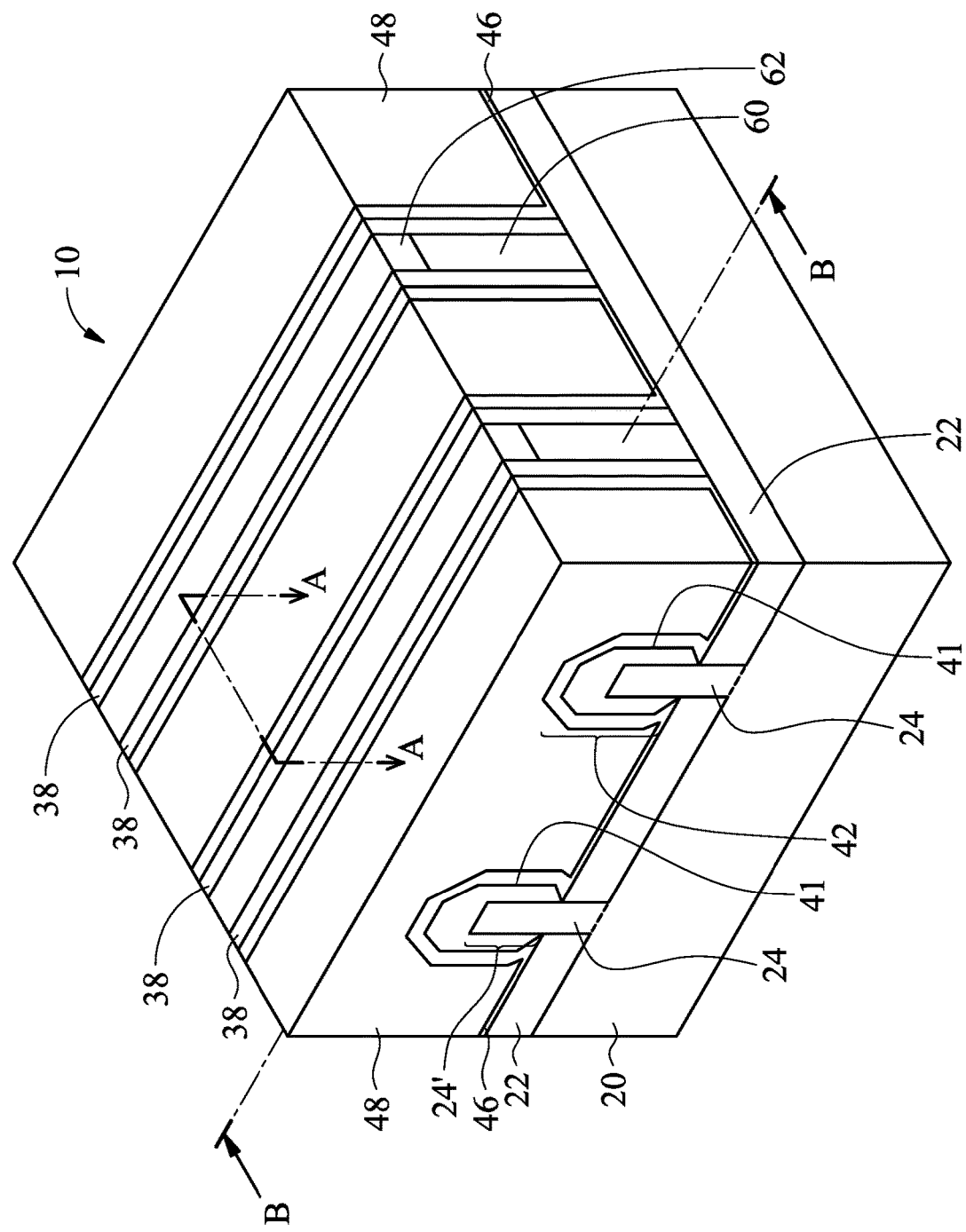
Figure 8B:
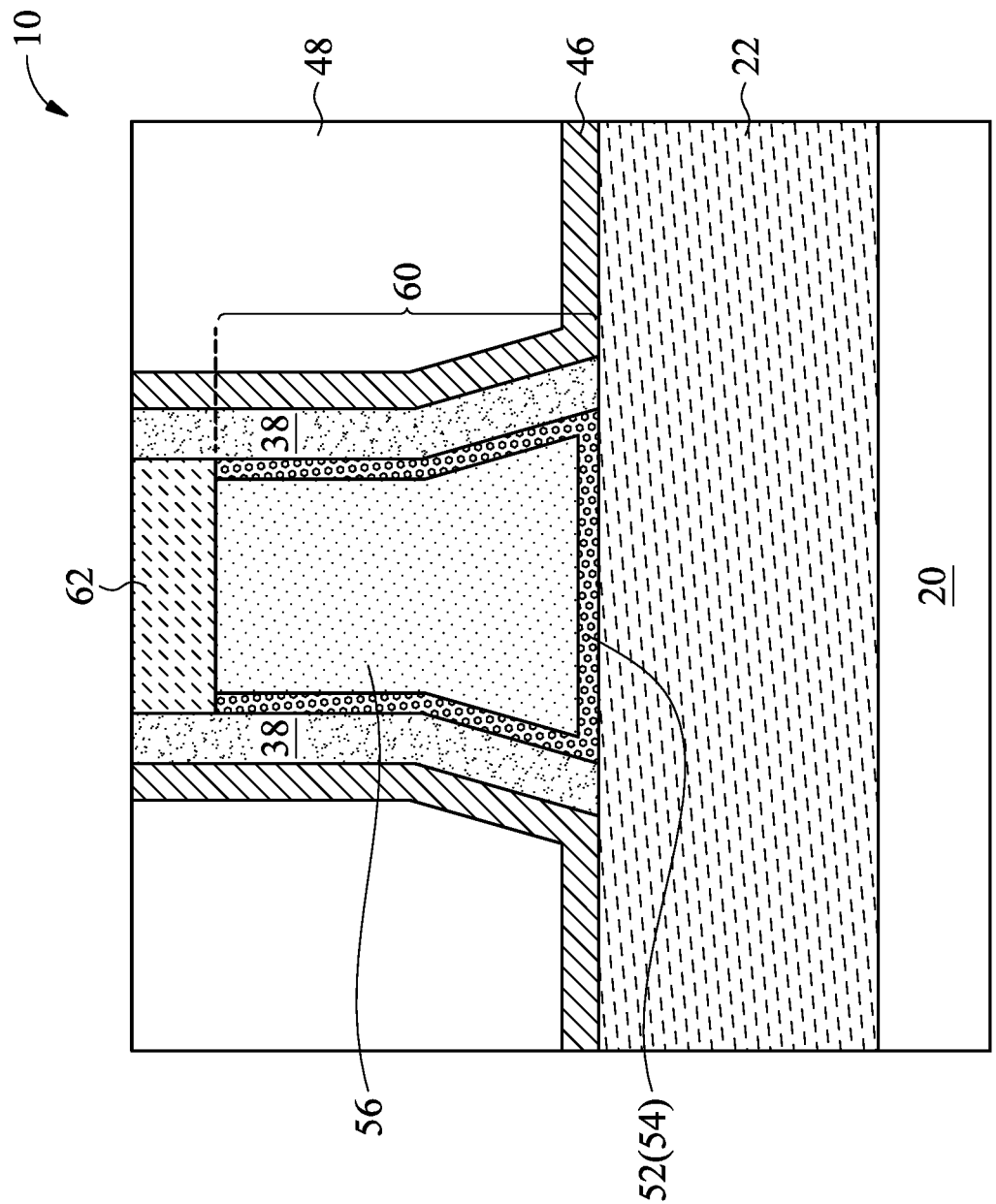
Figure 8C:
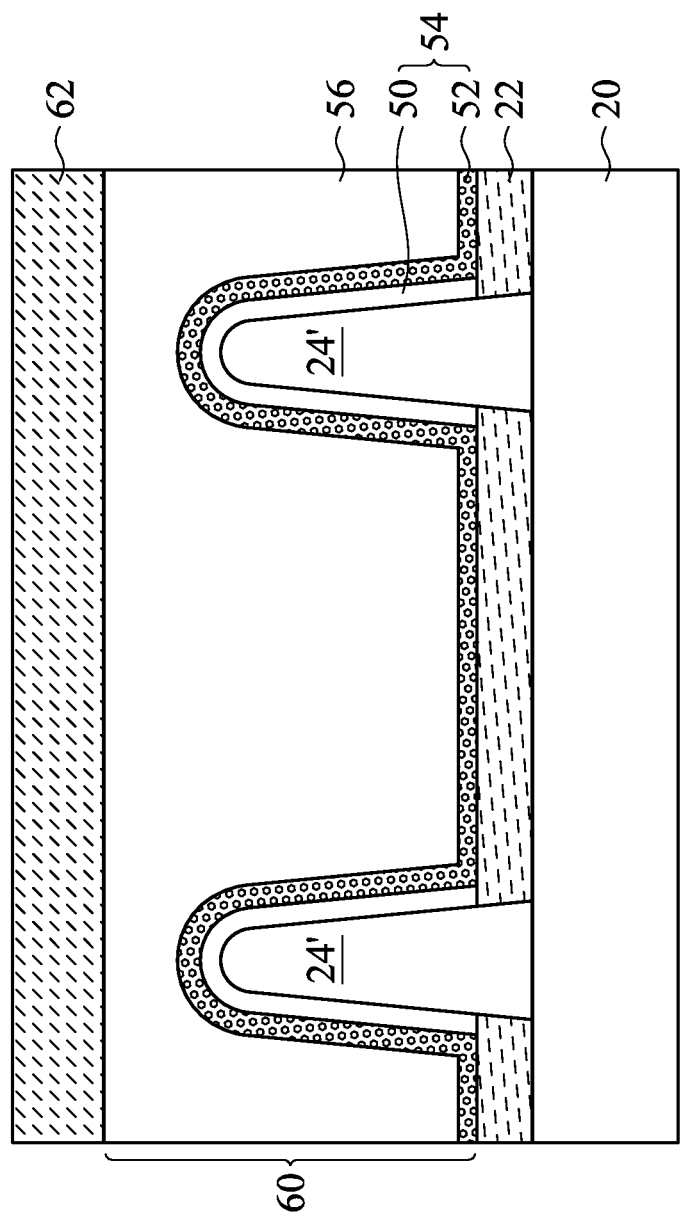

Next, as shown in FIGS. 8A, 8B, and 8C, hard masks 62 are formed. The respective step is illustrated as step 214 in the process flow 200 as shown in FIG. 15. The material of hard masks 62 may be the same as or different from some of CESL 46, ILD 48, and/or gate spacers 38. In accordance with some embodiments of the present disclosure, the formation of hard masks 62 includes recessing replacement gate stacks 60 through etching to form recesses, filling a dielectric material into the recesses, and performing a planarization to remove the excess portions of the dielectric material. The remaining portions of the dielectric material are hard masks 62. In accordance with some embodiments, hard masks 62 are formed of silicon nitride, silicon oxynitride, silicon oxy-carbide, silicon oxy carbo-nitride, or the like.

Figure 8D:
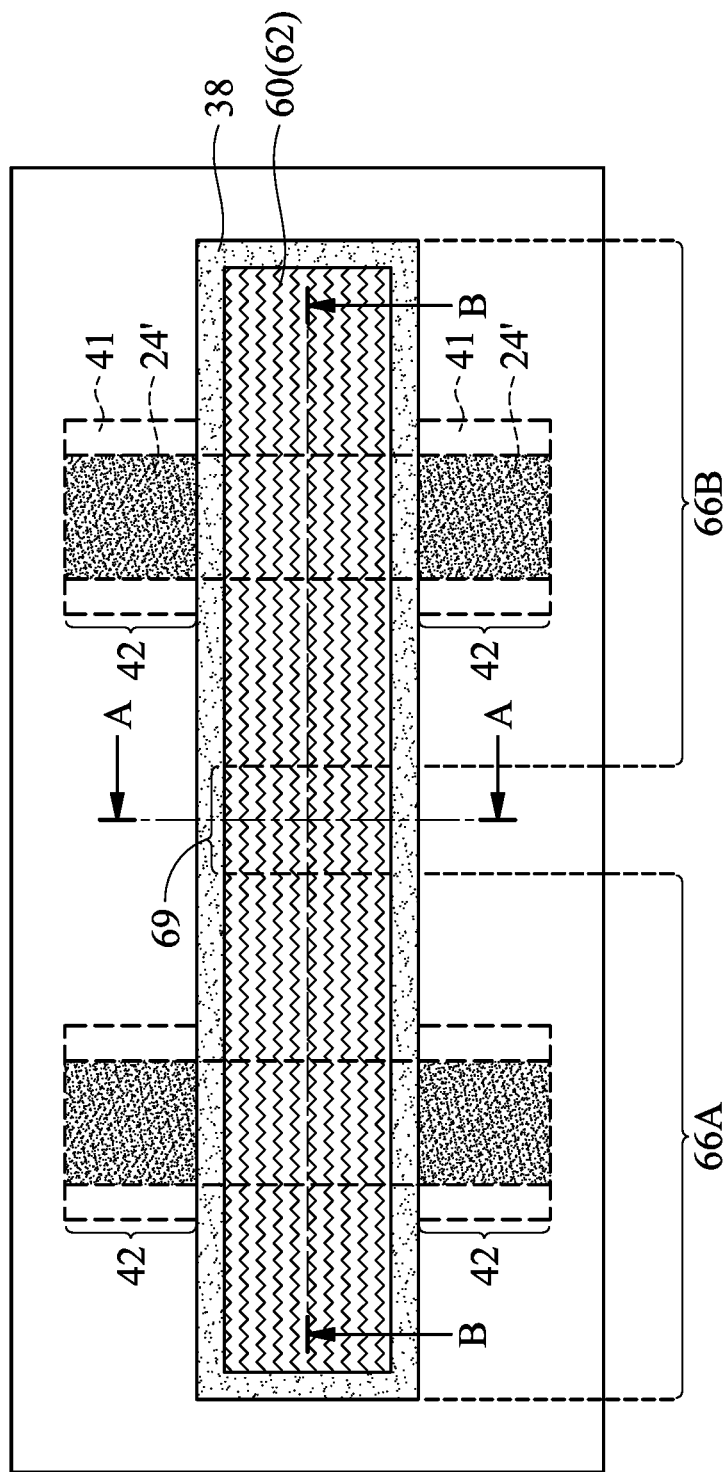

FIG. 8D illustrates a top-view of a portion of the structure shown in FIG. 8A. One of replacement gate stacks 60 and the overlying hard mask 62 are illustrated. Gate spacer 38 may form a ring fully encircling replacement gate stack 60 and hard mask 62. Furthermore, replacement gate stack 60 crosses over the protruding fins 24' of FinFETs 66A and 66B, which share a common replacement gate stack 60 at this stage.

FIG. 8B illustrates a cross-sectional view of the structure shown in FIG. 8D, with the cross-sectional view obtained from the plane containing line A-A in FIG. 8D, and the plane is also the same plane containing line A-A in FIG. 8A. FIG. 8C illustrates a cross-sectional view of the structure shown in FIG. 8D, with the cross-sectional view obtained from the plane containing line B-B in FIG. 8D.

Figure 9A:
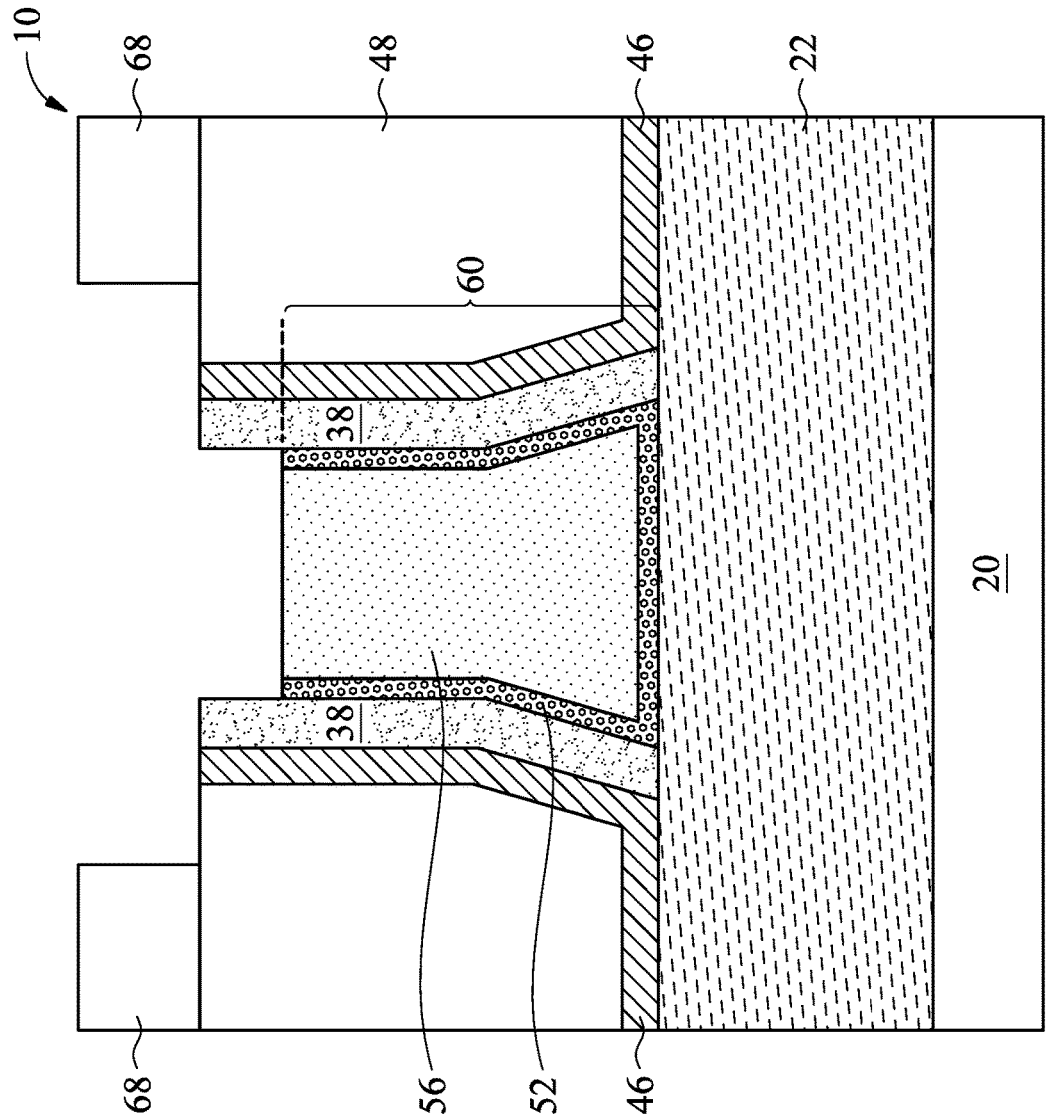
Figure 9B:
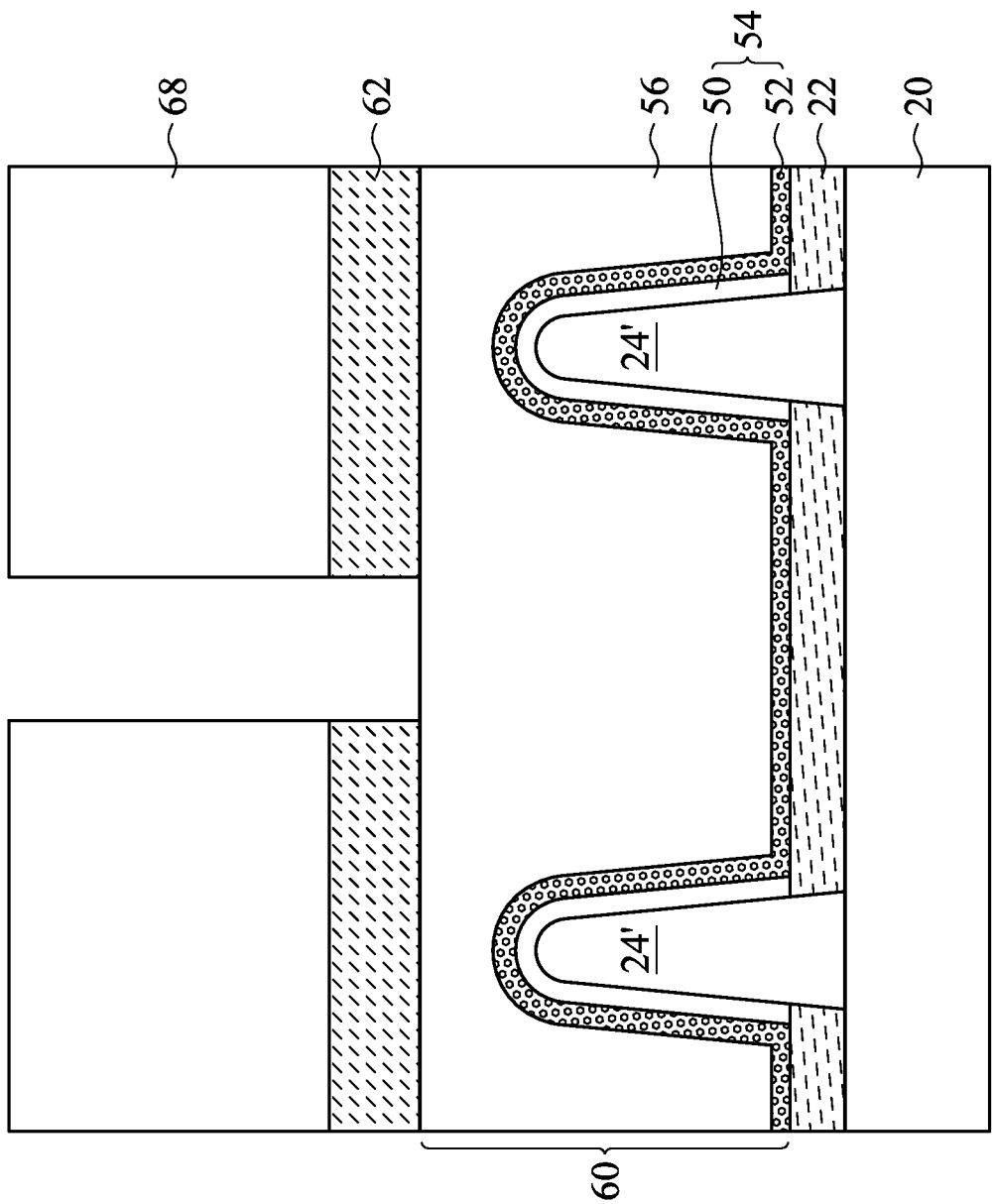

A portion of hard mask 62 is then etched, and the etched portion is shown as in region 69 in FIG. 8D. Referring to FIG. 9B, the etching process includes forming a patterned photo resist 68 over hard mask 62, and etching hard mask 62 using photo resist 68 as an etching mask. FIGS. 9A and 9B illustrate the cross-sectional views obtained from the same planes containing line A-A and line B-B, respectively, in FIG. 8D. The respective step is illustrated as step 216 in the process flow 200 as shown in FIG. 15. After hard mask 62 is etched, photo resist 68 may be removed.

Figure 10A:
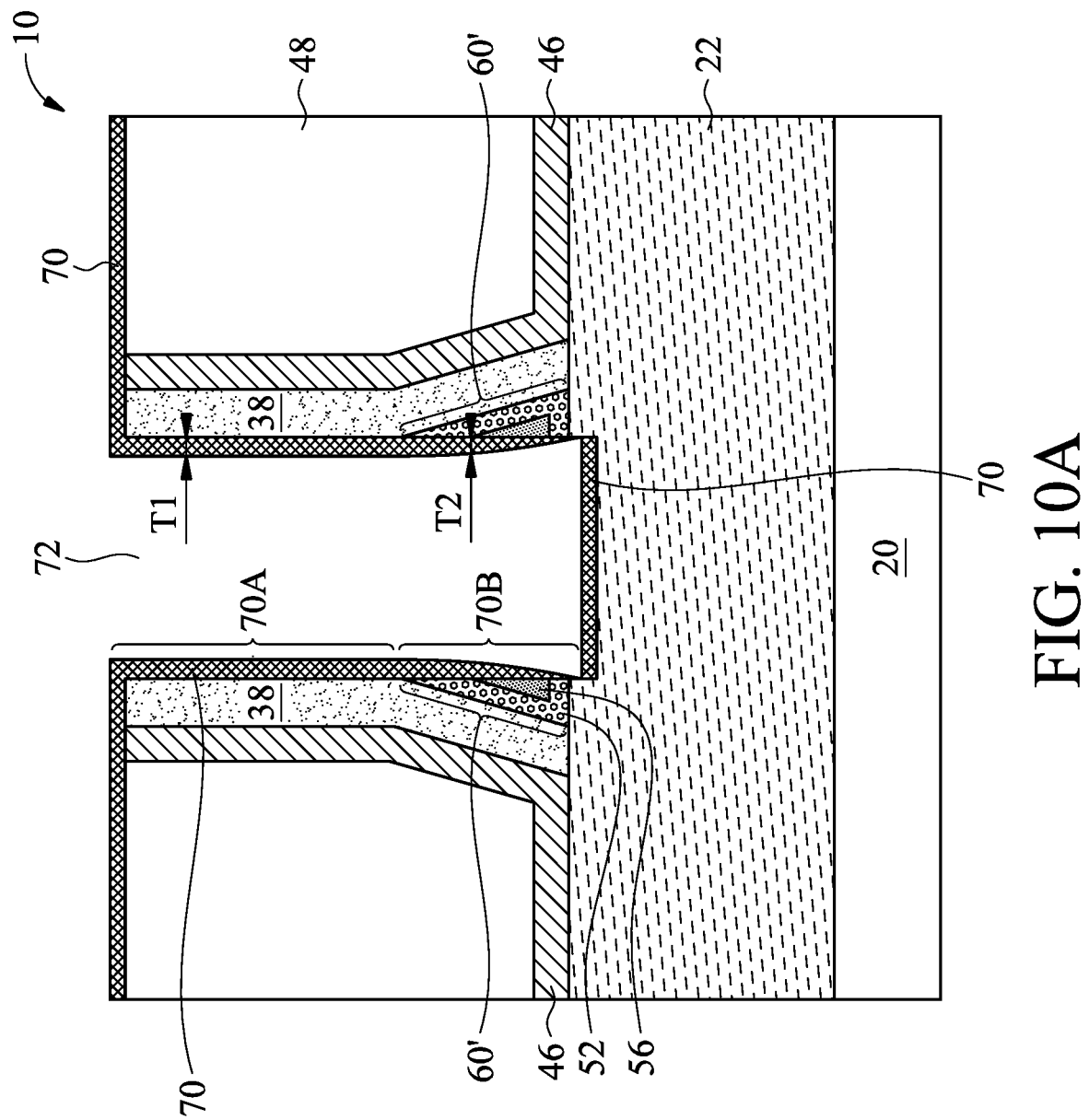
Figure 10B:
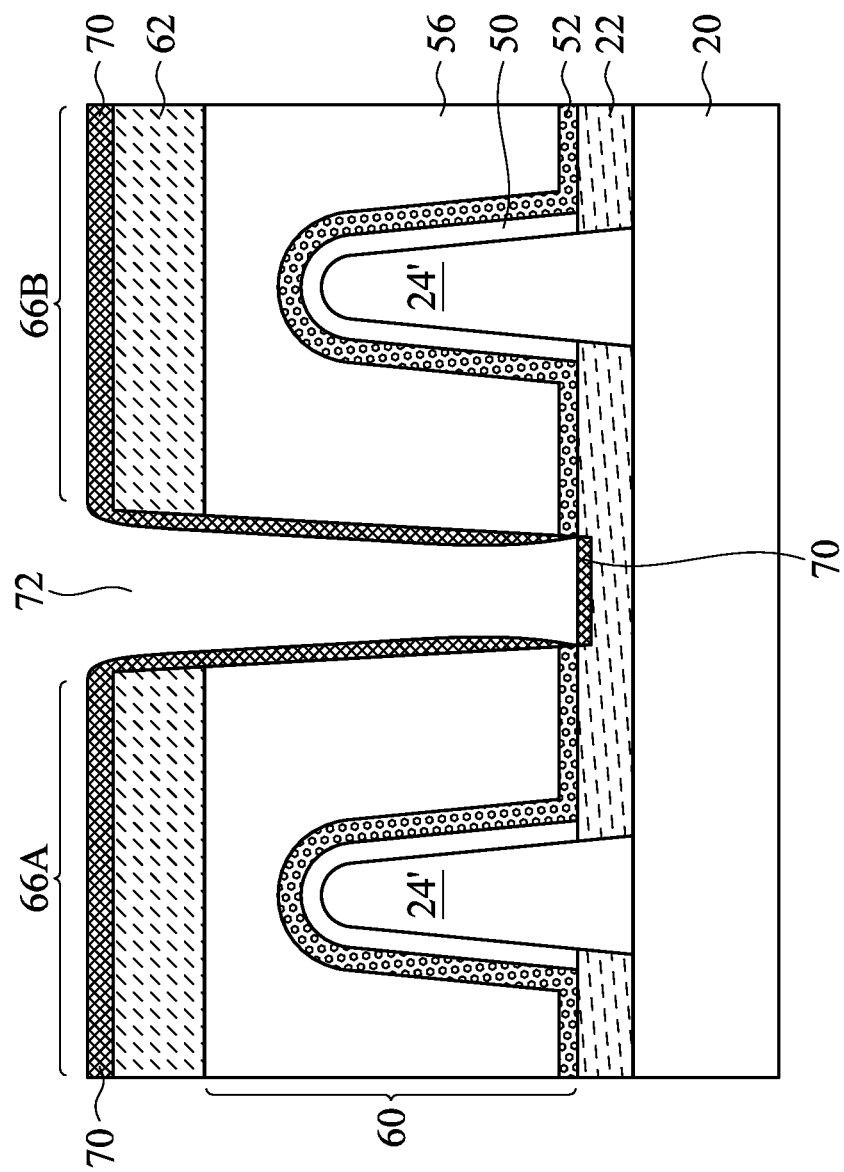

FIGS. 10A and 10B illustrate the main etching of gate stack 60. The respective step is illustrated as step 218 in the process flow 200 as shown in FIG. 15. FIGS. 10A and 10B illustrate the cross-sectional views obtained from the same planes containing line A-A and line B-B, respectively, in FIG. 8D. The main etching removes the portions of gate electrode in region 69 in FIG. 8D, and is used for cutting apart replacement gate stack 60 in FIG. 8D into two portions, each acting as a replacement gate electrode of one of FinFETs 66A and 66B, as shown in FIGS. 8D and 10B. The respective step is thus referred to as a cut-metal (or cut-metal-gate) process. The etching results in opening 72, as shown in FIGS. 10A and 10B. In accordance with some embodiments, opening 72 extends to STI region 22, and may slightly extend into STI region 22.

In accordance with some embodiments of the present disclosure, the main etching includes a plurality of etching-deposition cycles, each including an etching step and a polymer-deposition step. In accordance with some embodiments of the present disclosure, the etching is performed using process gases selected from, and not limited to, $Cl_2$, $BCl_3$, Ar, $CH_4$, $CF_4$, and combinations thereof. The etching may be performed with a pressure in the range between about 3 mTorr and about 10 mTorr. An RF power is applied in the main etching, and the RF power may be in the range between about 500 Watts and about 900 Watts. A bias power smaller than about 150 Watts may also be applied.

The deposition results in the formation of polymer layer 70, which includes portions on the sidewalls of opening 72 to protect the sidewalls, so that the upper portions of opening 72 are not laterally expanded when the opening 72 is extended downwardly. In accordance with some embodiments of the present disclosure, the deposition of polymer layer 70 is performed using process gases including $SiCl_4$, $O_2$, Ar, and the like. The deposition may be performed with a pressure in the range between about 2 mTorr and about 15 mTorr, an RF power in the range between about 400 Watts and about 900 Watts, and a bias power smaller than about 150 Watts. The resulting polymer layer 70 includes the elements of silicon (Si), oxygen (O), and carbon (C). Furthermore, polymer layer 70 includes $SiO_2$ therein compounded with additional elements.

Each of etching-deposition cycles results in opening 72 to extend further down, until STI region 22 is exposed. Gate spacers 38 are exposed by the etching in each cycle, and are then covered by the subsequently deposited polymer layer 70. The etching is anisotropic, and hence the sidewalls of openings 72 are substantially vertical. Polymer layer 70 includes top horizontal portions on top surfaces of gate spacers 38, ILD 48, and CESL 46, and bottom horizontal portions at the bottom of opening 72. There may be three or four (or fewer or more) etching-deposition cycles. After each of the cycles or after the final cycle is performed, a post-etching curing may be performed, for example, using a mixture of gases $O_2$, $N_2$, and $H_2$. The pressure of the curing gases may be in the range between about 3 mTorr and about 10 mTorr. An RF power may be applied in the curing, and the RF power may be in the range between about 500 Watts and about 900 Watts. The curing removes the chlorine-containing polymers formed in the cycles.

Since the etching is anisotropic, footing portions 60' are not etched due to the shadowing of gate spacers 38, which overlap footing portions 60'. Footing portions 60' include portions of high-k dielectric layer 52, and some remaining portions of metal gate electrode 56. The remaining portions of metal gate electrode 56 may include TSN, TaN, and/or TiN, or more, depending on the widths of footing portions 60'.

The polymer layer 70 formed in the preceding process has upper portion 70A in opening 72, and lower portion 70B underlying upper portion 70A. The thickness T2 of lower portion 70B is smaller than the thickness T1 of portion 70A. For example, thickness T2 may be smaller than about 50 percent, and may be smaller than about 30 percent, thickness T1. Also, upper portion 70A may have a substantially uniform thickness, while the lower portion 70B may have increasingly smaller thicknesses with the increase of depth into opening 72.

Figure 11:
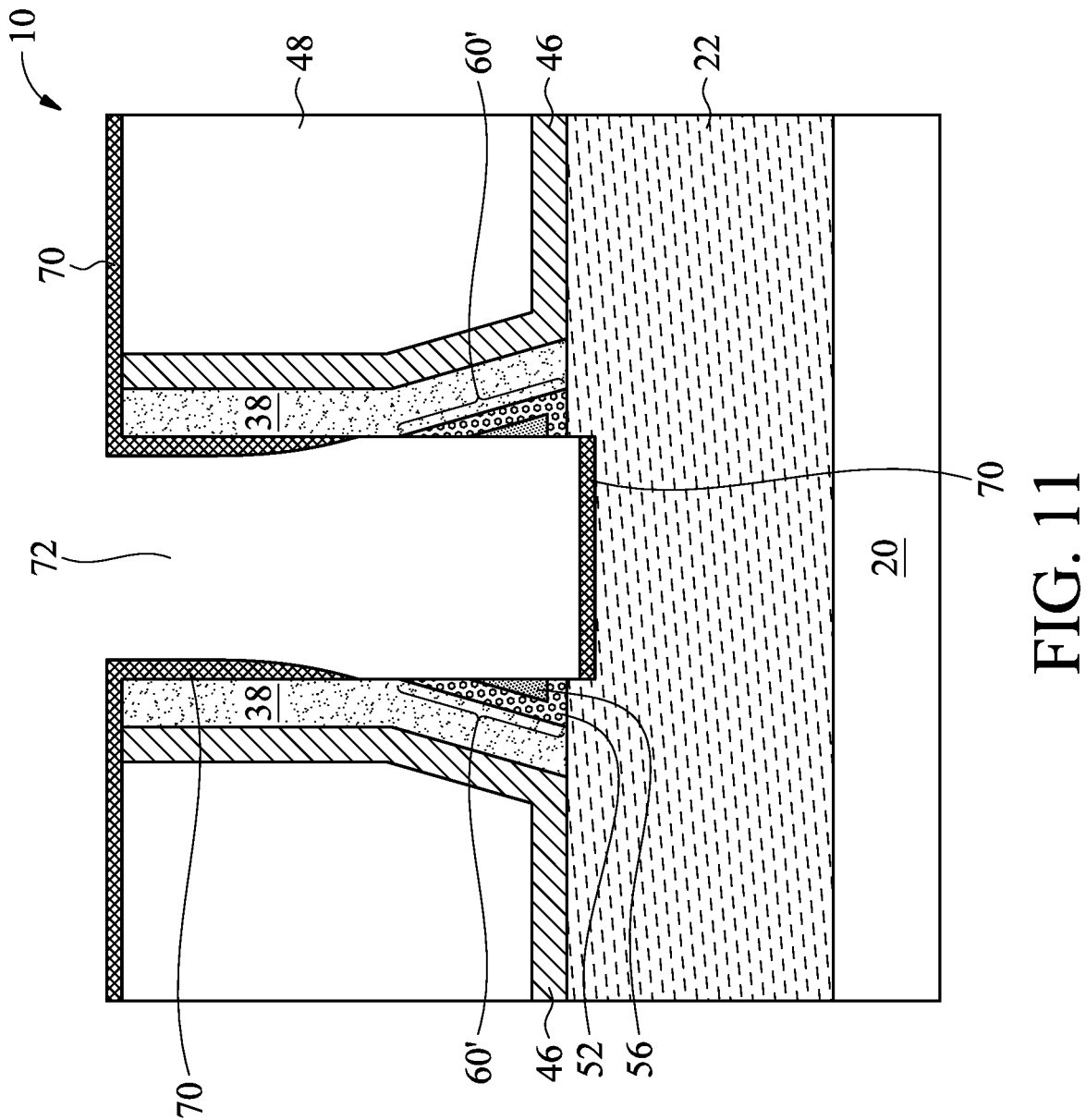

Next, a wet etching process, which is isotropic, is performed to thin at least lower portions 70B, which are relatively thin, of polymer layer 70, so that footing portions 60' are exposed. The resulting structure is shown in FIG. 11. The respective step is illustrated as step 220 in the process flow 200 as shown in FIG. 15. The thick portions of polymer layer 70, which thick portions include the horizontal portions and upper portions 70A, are thinned, and may not be fully removed. In accordance with some embodiments of the present disclosure, the wet etching is performed using a chemical solution, which may be diluted HF. The etching may be performed at a temperature in the range between about 20° C. and about 30° C., and the etching time may be in the range between about 30 seconds and about 60 seconds.

During the wet etching, the etchant is selected so that polymer layer 70 is etched partially, while the materials in footing portions 60' are substantially not etched. This may be achieved, for example, by adjusting the concentration of the etching solution (such as HF) to be low enough. In accordance with alternative embodiments, in the etching solution, the weight ratio of water to HF in the diluted HF is greater than about 1,500:1, and may be in the range between about 1,500:1 and about 2,500:1. It is appreciated that the effect of etching is related to the concentration of the diluted HF, and a high concentration, for example, about 500:1 or higher may result in all polymer layer 70 and footing portions 60' to be removed, and spacers 38 damaged. Accordingly, the concentration of the diluted HF is selected to be low enough.

Next, an additional etching is performed to remove the portions of gate electrode 56 in footing gate stack portions 60'. The respective step is illustrated as step 222 in the process flow 200 as shown in FIG. 15. The etching is represented as arrows 74 in FIG. 12A. High-k dielectric layer 52 is not etched, and remains in the final structure. As can be realized from FIG. 12 and FIG. 8D, the high-k dielectric layer 52 of the gate stack of transistor 66A and the high-k dielectric layer 52 of the gate stack of transistor 66B are physically connected by the remaining high-k dielectric layer 52 in region 69 (FIG. 8D). Since high-k dielectric layer 52 is not electrically conductive, although the remaining portions of high-k dielectric layer 52 physically connect the gate stack of transistor 66A (FIGS. 10B and 8D) to the gate stack of transistor 66B, there is no electrical connection.

Referring back to FIG. 12A, etching process 74 may be a dry etching process, which is performed using $NF_3$ as an etching gas. The pressure of $NF_3$ may be in the range between about 1,000 and about 2,000 mTorr. The temperature of the respective wafer is in the range between about 50° C. and about 75° C. The etching time may be in the range between about 60 seconds and about 180 seconds. By etching the metal layers and leaving the high-k dielectric layer 52, high-k dielectric layer 52 may be used as a protection layer for reducing the lateral etching, especially in the footing regions. Also, to leave high-k dielectric layer 52 not etched, the etching may be mild, and the damage to the hard mask (62 in FIG. 10B) is reduced due to the mild etching.

The etching of TiN, TaN, and TSN in the portions of gate electrode 56 in footing portions 60' may be expressed using the following reaction formulas:

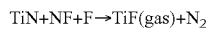

$TiN+NF+F \rightarrow TiF(gas)+N_2$

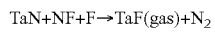

$TaN+NF+F \rightarrow TaF(gas)+N_2$

$TiSiN+NF+F \rightarrow TiF(gas)+SiF(gas)+N_2$.

The products of the etching are gaseous, and hence may be removed.

A curing step using oxygen ($O_2$) as a process gas may also be performed. The curing may last for a period of time between about 10 seconds and about 40 seconds. The curing may also be skipped. Next, another etching using $NF_3$ may follow the oxygen curing. The etching using $NF_3$ may be performed using similar process conditions as the preceding etching (which is also performed using $NF_3$). The oxygen curing in combination with the etching using $NF_3$ can effectively etch TiN, TaN, and TSN, particularly TaN, which is typically difficult to etch.

Figure 12A:
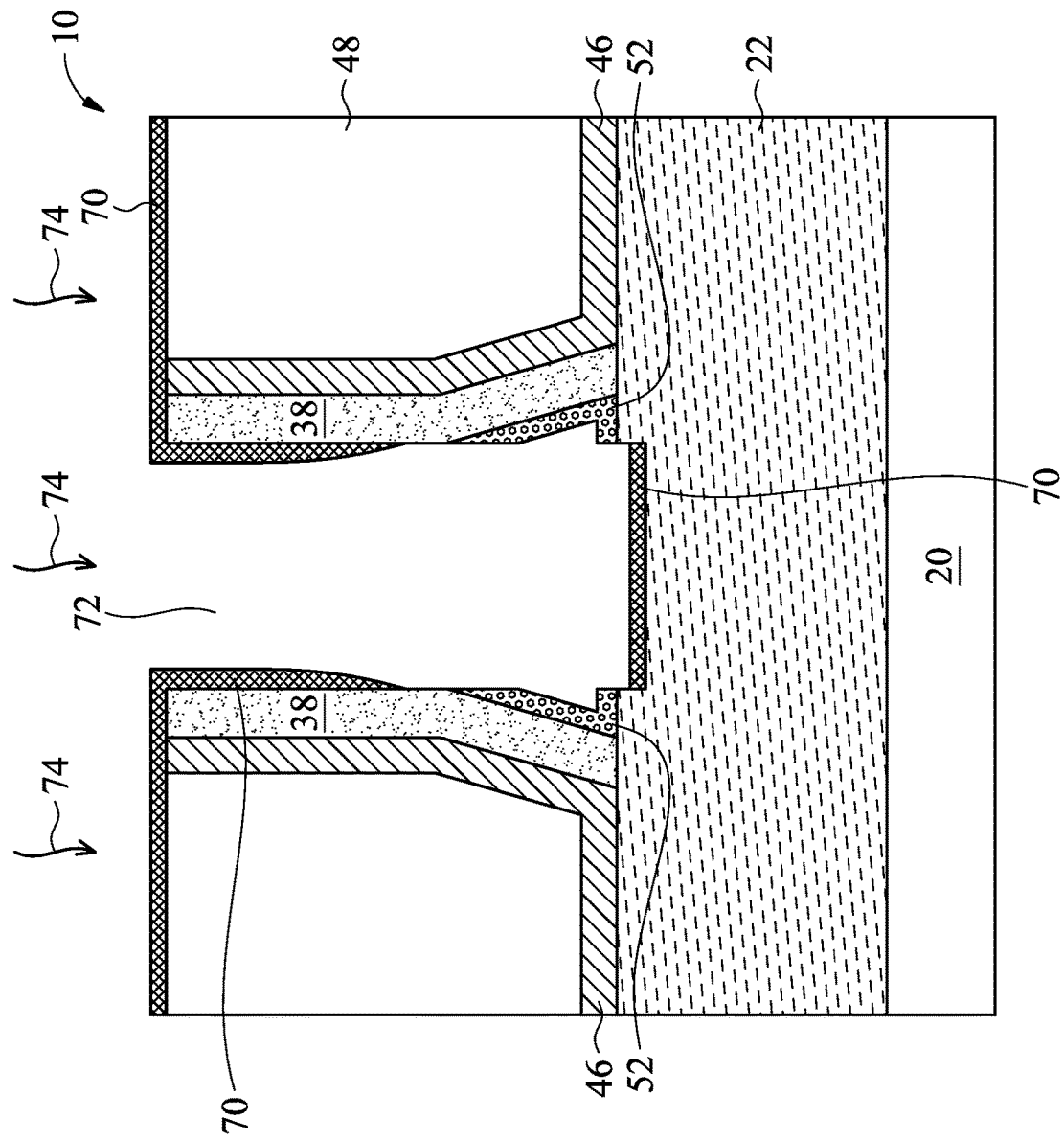
Figure 12B:
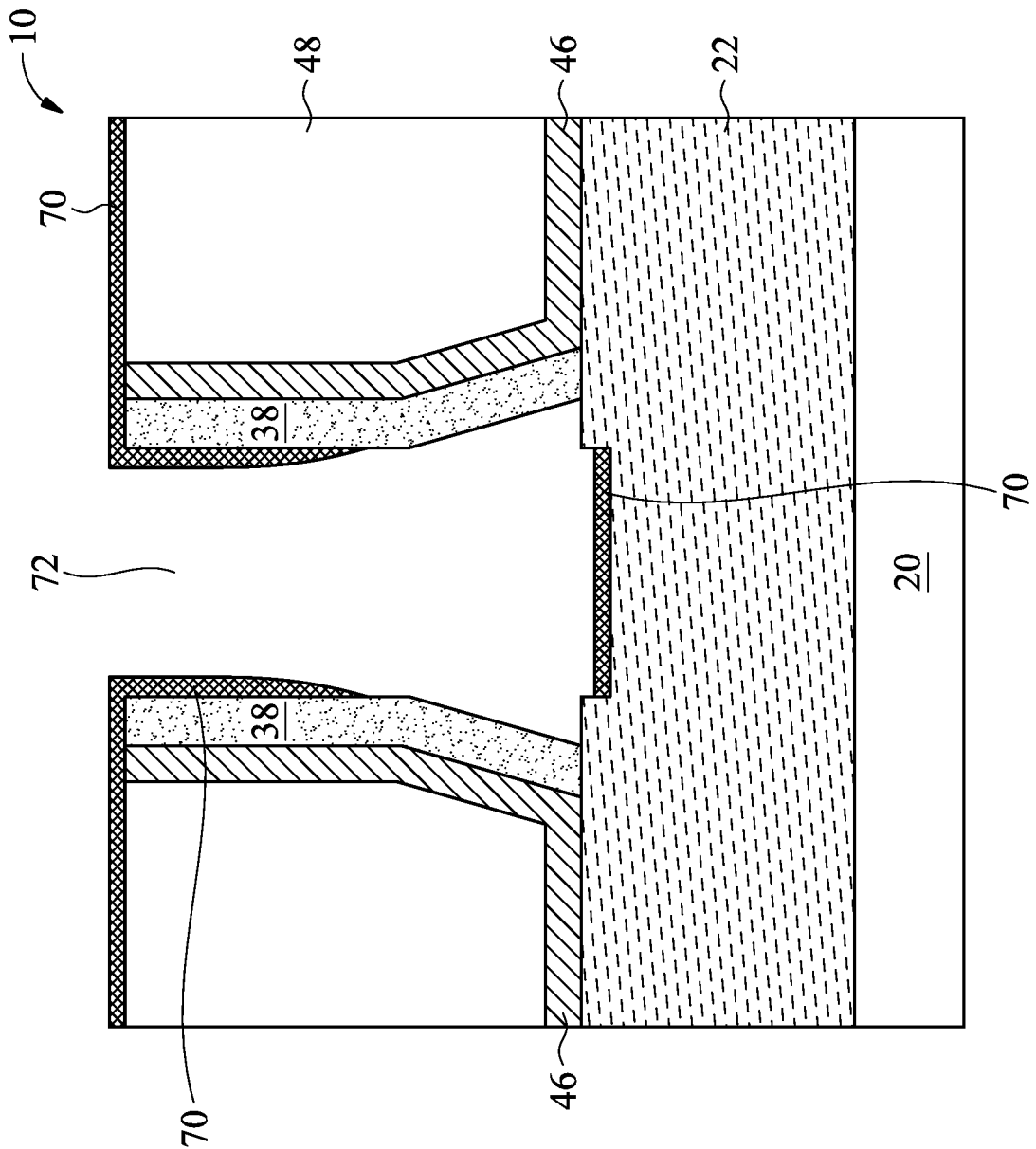

In accordance with alternative embodiments of the present disclosure, rather than performing the steps shown in FIGS. 11 and 12A, a wet etching is performed for thinning polymer layer 70 (FIG. 10A), and the etching solution is adjusted, so that the etching solution simultaneously attacks the exposed footing portions 60' (including gate electrodes 56 and high-k dielectric layers 52). In the resulting structure, footing portions 60' are removed, and the resulting structure is shown in FIG. 12B. In accordance with some embodiments of the present disclosure, the wet etching is performed using a chemical solution including ammonia fluoride ($NH_4F$). The concentration of $NH_4F$ is adjusted to be high enough so that it may etch both polymer layer 70 and footing gate stack portions 60'. For example, the concentration of $NH_4F$ may be higher than about 18 percent, and may be in the range between about 18 percent and about 25 percent. It is appreciated that the concentration of $NH_4F$ affects the result, and a low concentration may not be able to etch some metal layers such as TaN. When the metal layers are not etched, high-k dielectric layer 52 will also be protected by the metal layer. Accordingly, to effectively remove footing gate stack portions 60', the concentration of $NH_4F$ is selected depending on the materials and the composition of footing portions 60' to ensure the effective etching. The etching may be performed at a temperature in the range between about 20° C. and about 30° C., and the etching time may be in the range between about 10 seconds and about 30 seconds.

Figure 13A:
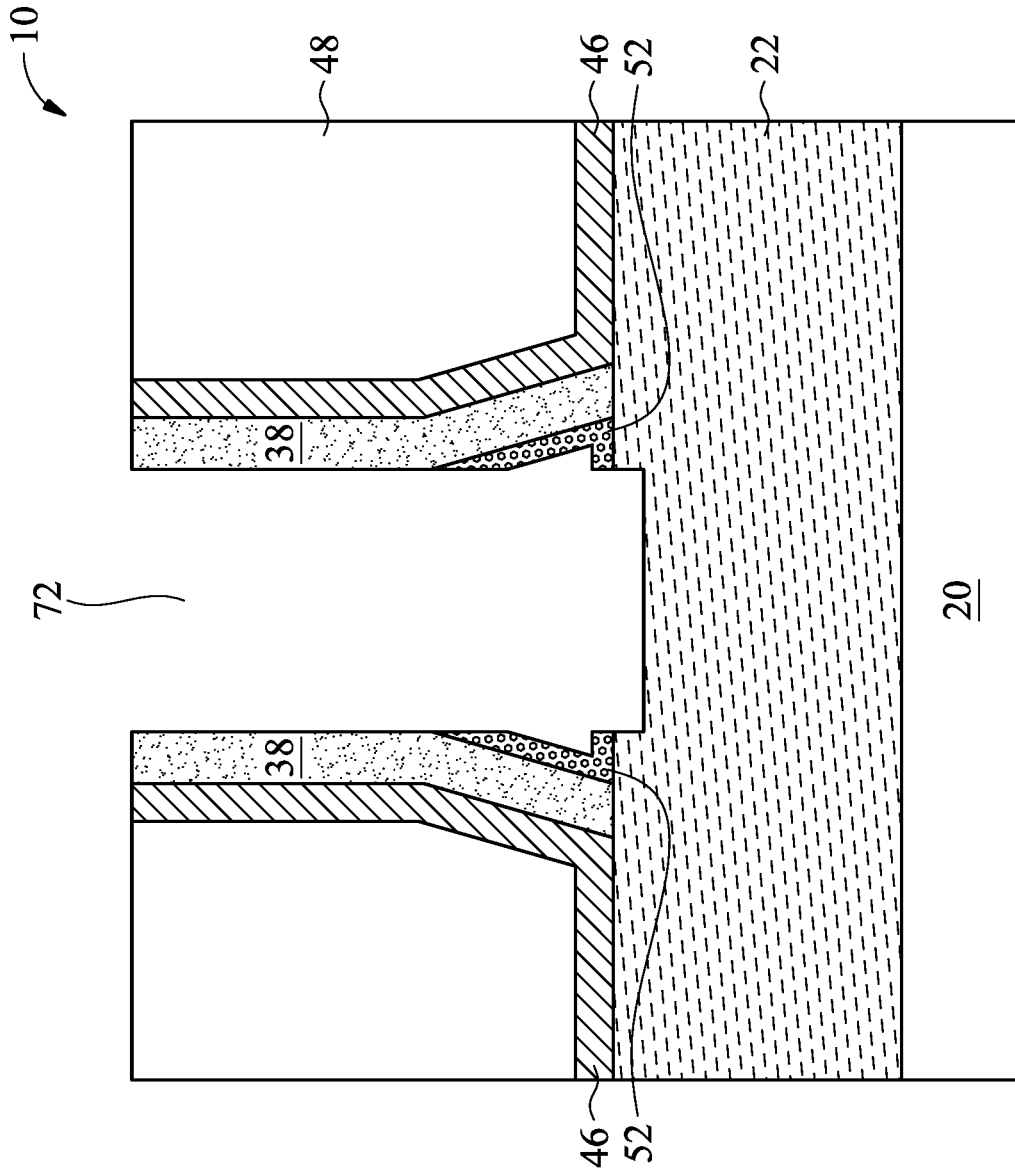
Figure 13B:
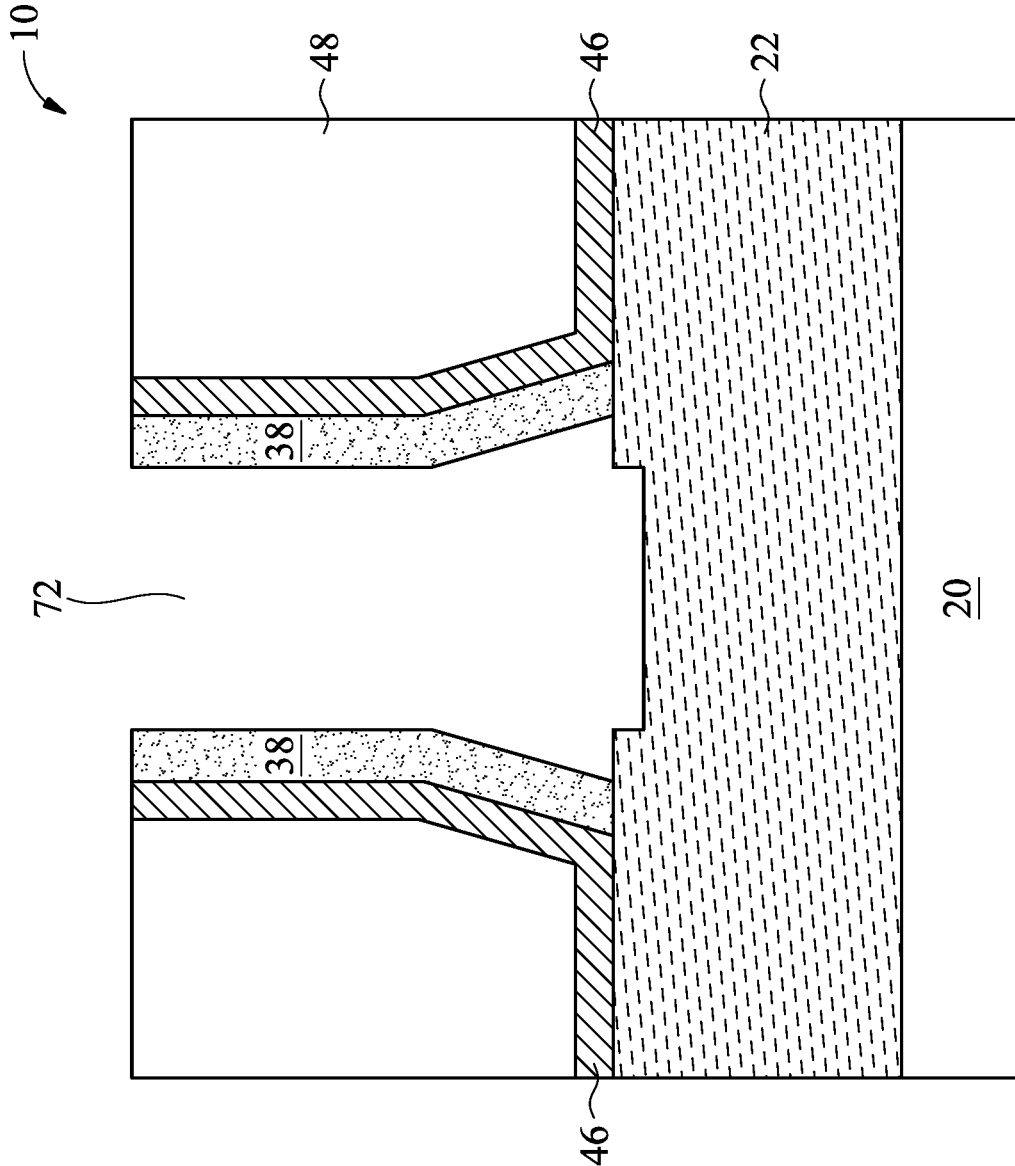

In accordance with some embodiments of the present disclosure, after the structure as shown in FIG. 12A or 12B is formed, the remaining polymer layer 70 is removed, for example, using ultra-diluted HF as an etching chemical. The resulting structure is shown in FIGS. 13A and 13B, respectively. The respective step is illustrated as step 224 in the process flow 200 as shown in FIG. 15. In accordance with alternative embodiments of the present disclosure, the etching of polymer layer 70 is skipped, and polymer layer 70 will be left in the final structure. Accordingly, step 224 in FIG. 200 is illustrated in a dashed box to indicate it may or may not be performed.

Figure 14A:
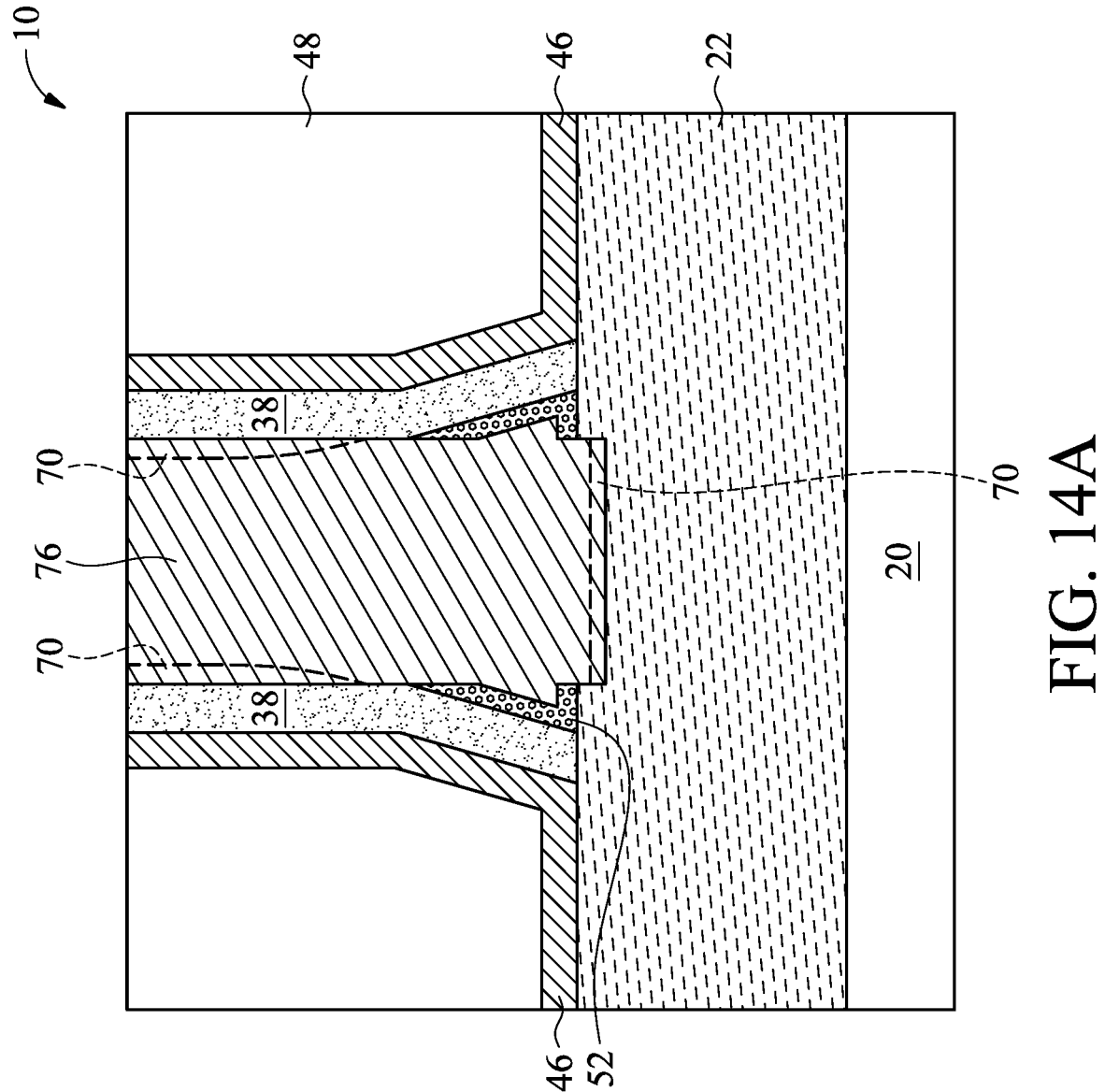
Figure 14B:
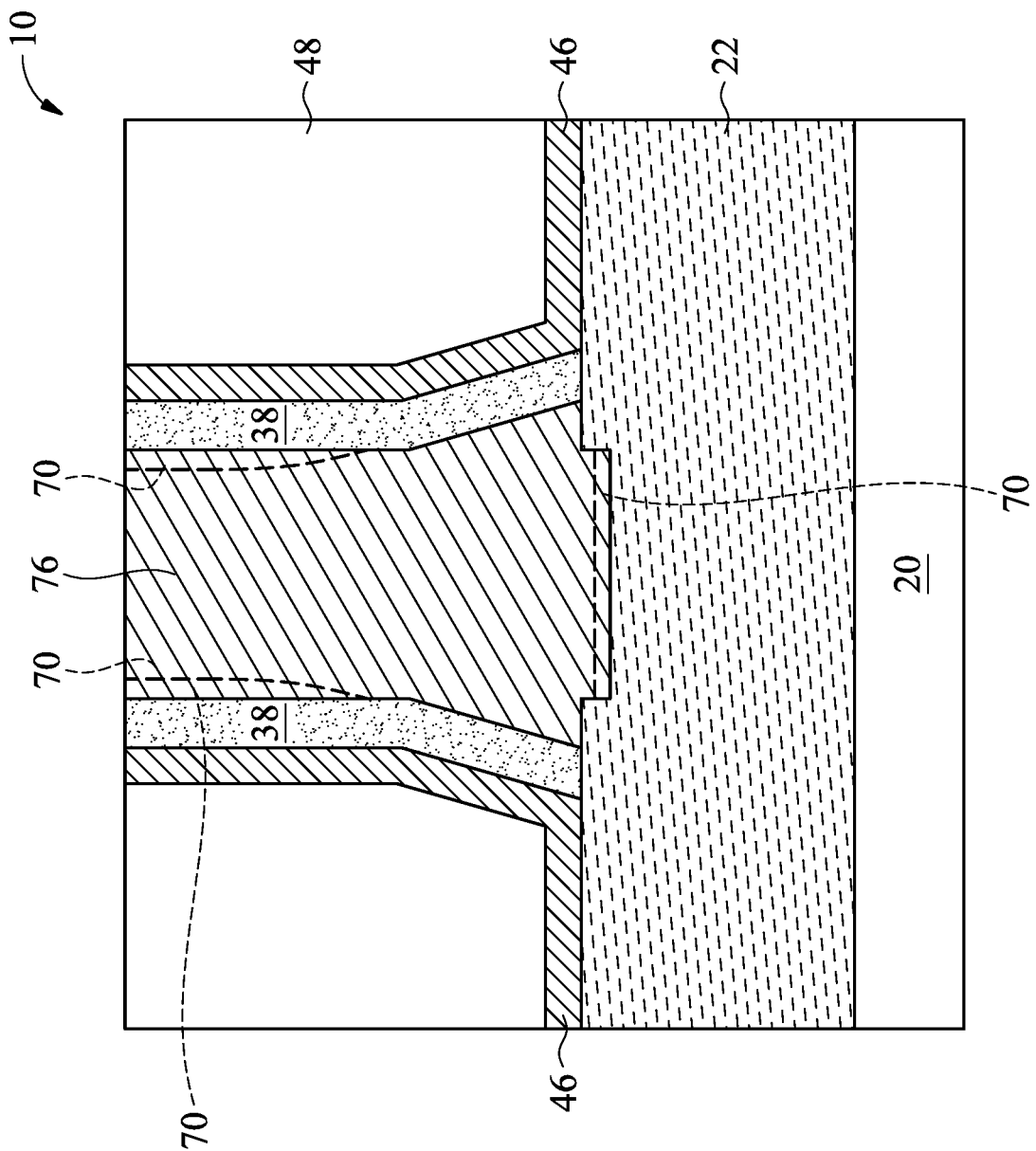
Figure 14C:
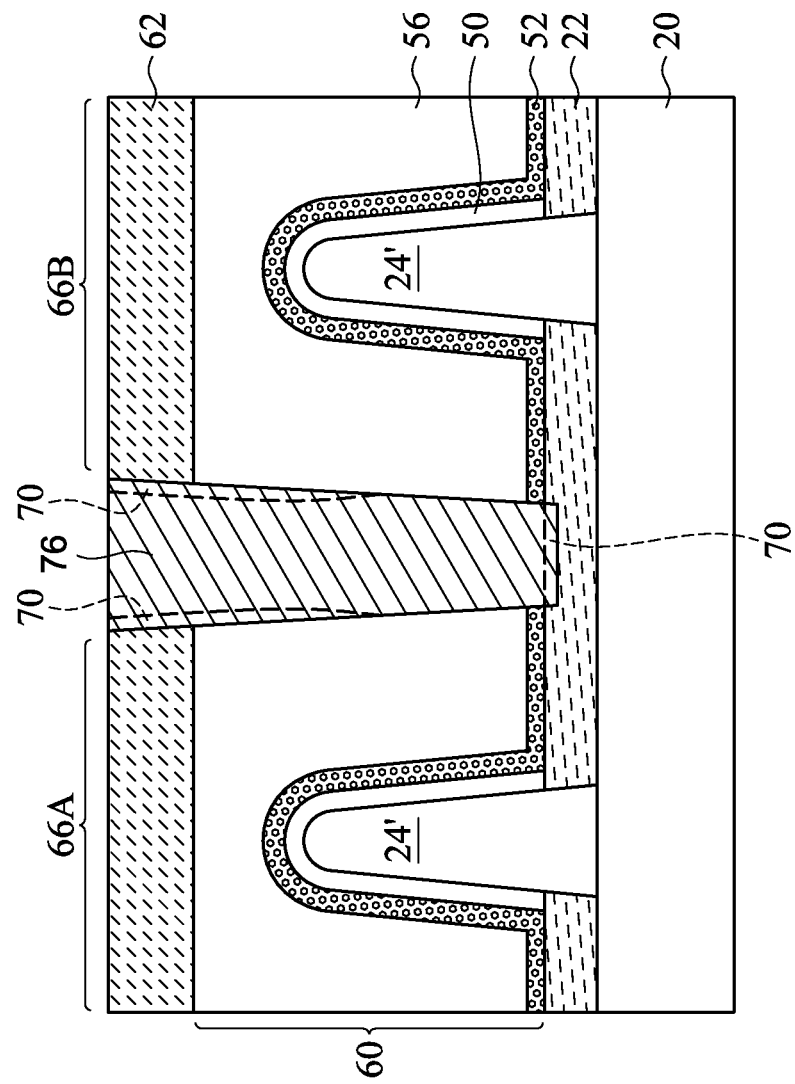
Figure 14D:
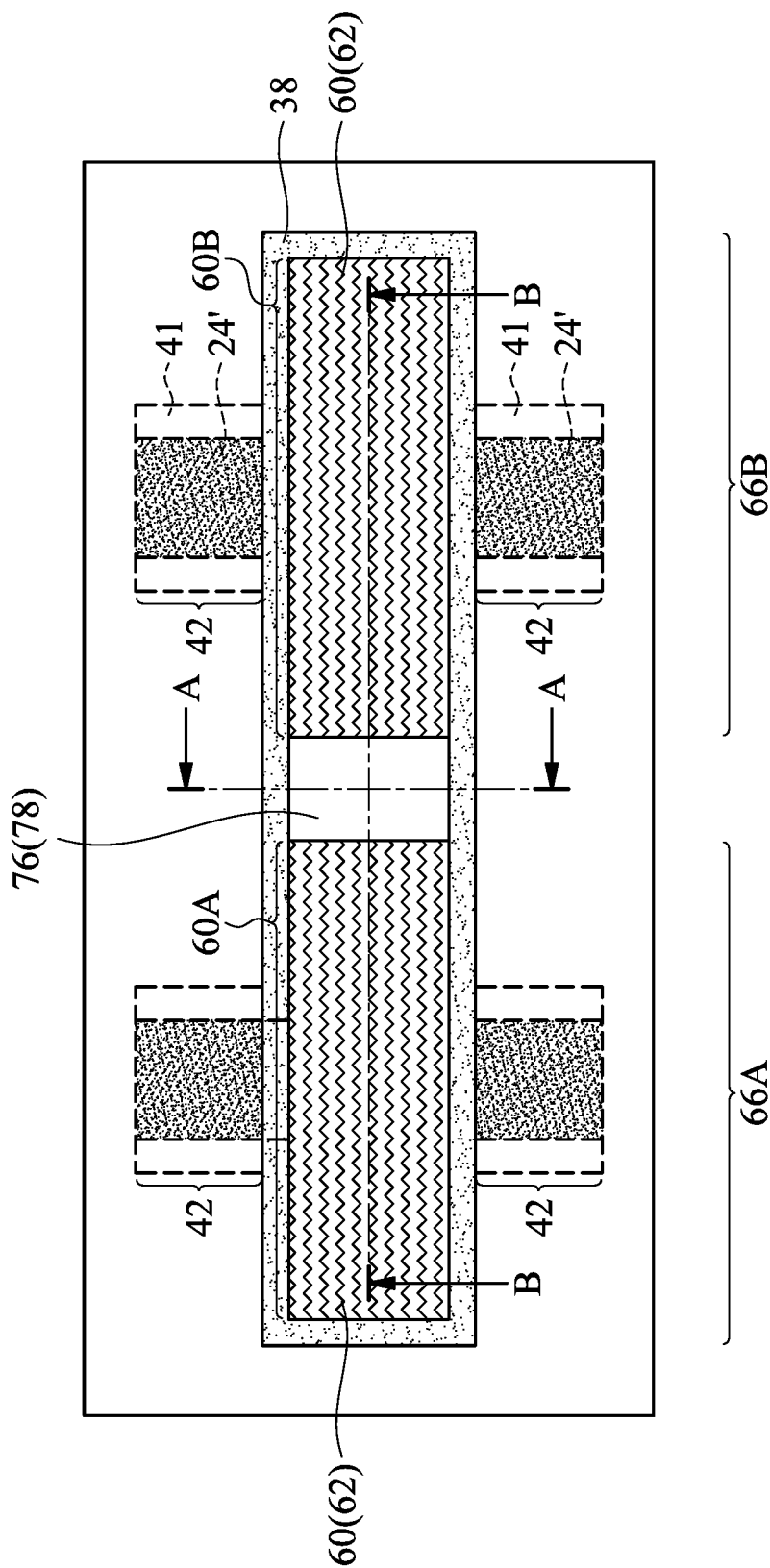
Figure 15:
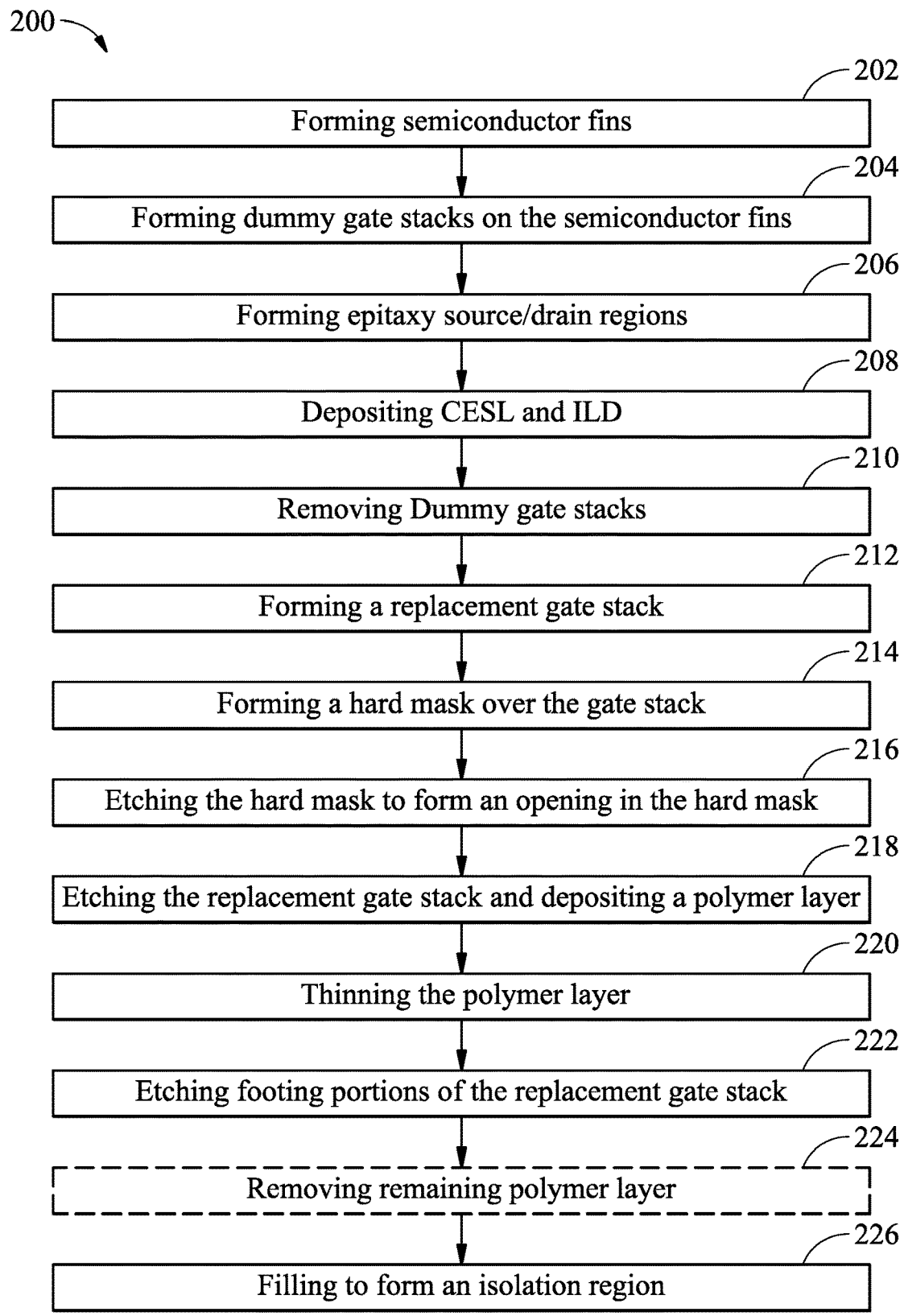
FIG. 15 illustrates a process flow for forming FinFETs in accordance with some embodiments.

FIGS. 14A, 14B, 14C, and 14D illustrate the formation of dielectric (isolation) region 76. The respective step is illustrated as step 226 in the process flow 200 as shown in FIG. 15. FIG. 14D illustrates a top view of the resulting structure, which shows that isolation region 76 separates the gate stack of FinFETs 66A and 66B. FIGS. 14A and 14B are obtained from the plane containing line A-A in FIG. 14D. FIG. 14C is obtained from the plane containing line B-B in FIG. 14D.

The formation of dielectric (isolation) region 76 may include depositing a dielectric material into opening 72 (FIGS. 13A and 13B), and performing a planarization such as CMP or mechanical grinding to remove the excess portions of the dielectric material. The filling method may include low-pressure chemical vapor deposition, spin-on coating, Plasma Enhanced Chemical Vapor Deposition (PECVD), or the like. The filling material may include silicon nitride, silicon oxide, silicon carbide, silicon oxynitride, silicon oxy-carbide, or the like. FIG. 14A also shows polymer layers 70 using dashed lines to indicate they may be removed or may remain in the final structure. In FIG. 14A, high-k dielectric layers 52 remain, and are overlapped by the overhanging portions of gate spacers 38.

FIG. 14B illustrates the structure after the filling dielectric material is filled into opening 72 in FIG. 13B in accordance with some embodiments. Polymer layers 70 are also shown using dashed lines to indicate they may be removed or may remain in the final structure. In FIG. 14B, no high-k dielectric layers remain, and dielectric region 76 extends into the footing regions.

FIG. 14C illustrates a cross-sectional view obtained from the plane containing line B-B in FIG. 14D. Throughout the description, dielectric region 76 and polymer layer 70 (if remaining) are in combination referred to as isolation region 78 (FIG. 14D), which separates the gate stacks of FinFETs 66A and 66B from each other as replacement gate stacks 60A and 60B. In subsequent steps, more overlying ILDs (not shown) are formed, and gate contact plugs (not shown) are formed over and contacting gate stacks 60A and 60B. Silicide regions and source/drain contact plugs (not shown) are also formed over and contacting source/drain regions.

The embodiments of the present disclosure have some advantageous features. By etching footing portions of the replacement metal gate, the footing residue is eliminated, and the leakage is avoided. The lateral etching is reduced, and the loss of hard mask is also reduced. The process widow of the cut-metal process is enlarged.

In accordance with some embodiments of the present disclosure, method includes forming a gate stack comprising: a first portion over a portion of a first semiconductor fin; a second portion over a portion of a second semiconductor fin; and a third portion connecting the first portion to the second portion; performing an anisotropic etching on the third portion of the gate stack to form an opening between the first portion and the second portion, wherein a footing portion of the third portion remains after the anisotropic etching; performing an isotropic etching to remove a metal gate portion of the footing portion; and filling the opening with a dielectric material. In an embodiment, the isotropic etching comprises a wet etching using a chemical solution comprising $NH_4F$. In an embodiment, the isotropic etching comprises a dry etching using a process gas comprising $NF_3$. In an embodiment, the method further includes performing an additional isotropic etching to thin a polymer layer on a sidewall of the footing portion and to expose the footing portion. In an embodiment, the additional isotropic etching is performed using diluted HF, and during the additional isotropic etching, the footing portion is substantially un-etched. In an embodiment, in the isotropic etching, both a high-k dielectric portion and a metal gate electrode portion in the footing portion of the gate stack are removed. In an embodiment, in the isotropic etching, a metal gate electrode portion of the footing portion of the gate stack is removed, and a high-k dielectric portion of the footing portion of the gate stack remains. In an embodiment, the dielectric material contacts the high-k dielectric portion.

In accordance with some embodiments of the present disclosure, a method includes forming a gate stack between a first gate spacer and a second gate spacer, the gate stack comprising: a gate dielectric; and a metal electrode over the gate dielectric; etching a first portion of the gate stack to expose sidewalls of the first gate spacer and the second gate spacer; depositing a polymer layer on the sidewalls of the first gate spacer and a second gate spacer; thinning the polymer layer to expose a footing portion of the gate stack, wherein the footing portion is overlapped by a portion of the first gate spacer; and etching a remaining portion of the metal electrode in the footing portion. In an embodiment, after the etching the remaining portion of the metal electrode, a portion of the gate dielectric in the footing portion remains. In an embodiment, the thinning the polymer layer is performed using diluted HF solution as an etchant. In an embodiment, in the thinning the polymer layer, the footing portion is substantially un-etched. In an embodiment, the etching the remaining portion of the metal electrode comprises a first etching step using $NF_3$ as an etching gas. In an embodiment, the method further includes, after the first etching step: performing a curing step using oxygen as a process gas, wherein a remaining portion of the gate stack is exposed to the oxygen; and performing a second etching step using $NF_3$ as an etching gas. In an embodiment, the method further includes filling a dielectric material into an opening left by the etched first portion of the gate stack. In an embodiment, the gate stack further comprises a second portion and a third portion joined by the first portion, and each of the second portion and the third portion is a gate electrode of a transistor.

In accordance with some embodiments of the present disclosure, a method includes forming a gate stack comprising a gate dielectric, and a gate electrode over the gate dielectric, wherein each of the gate dielectric and the gate electrode comprises: a first portion over a portion of a first semiconductor fin; a second portion over a portion of a second semiconductor fin; and a third portion connecting the first portion to the second portion; etching the third portion of the gate electrode to electrically disconnect the first portion of the gate electrode from the second portion of the gate electrode, wherein the third portion of the gate dielectric comprises a remaining portion after the etching, and wherein the first portion of the gate dielectric is physically connected to the second portion of the gate dielectric; and filling an opening left by the third portion of the gate electrode with a dielectric material. In an embodiment, the method further includes forming a gate spacer on a sidewall of the gate stack, wherein the remaining portion of the third portion of the gate dielectric is overlapped by the gate spacer. In an embodiment, the etching the third portion of the gate electrode comprises: an anisotropic etching to form the opening, wherein the anisotropic etching is performed until a top surface of a shallow trench isolation region underlying the gate electrode is reached; and an isotropic etching to remove a remaining portion of the gate electrode. In an embodiment, the isotropic etching is performed using $NF_3$ as an etching gas.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A structure comprising:
a first gate spacer and a second gate spacer;
a first transistor comprising:
   a first portion of the first gate spacer and a first portion of the second gate spacer;
   a first gate stack between the first portion of the first gate spacer and the first portion of the second gate spacer, the first gate stack comprising:
      a first gate dielectric; and
      a first gate electrode over a portion of the first gate dielectric;
a second transistor comprising:
   a second portion of the first gate spacer and a second portion of the second gate spacer;
   a second gate stack between the second portion of the first gate spacer and the second portion of the second gate spacer, the second gate stack comprising:
      a second gate dielectric; and
      a second gate electrode over a portion of the second gate dielectric;

an isolation region between the first gate spacer and the second gate spacer, wherein the isolation region is physically joined to the first gate electrode and the second gate electrode; and a dielectric layer formed of a same material as, and is physically connected to, the first gate dielectric and the second gate dielectric, wherein the dielectric layer is physically joined to a bottom portion of the isolation region, and wherein the dielectric layer comprises a horizontal portion and a slanted portion connecting to the horizontal portion, and wherein the dielectric layer is overlapped by a top portion of the first gate spacer.

2. The structure of claim 1, wherein the isolation region comprises a portion overlapping the horizontal portion of the dielectric layer.

3. The structure of claim 1, wherein the horizontal portion and the slanted portion form an acute angle in a cross-sectional view of the dielectric layer.

4. The structure of claim 1 further comprising:
a shallow trench isolation region, wherein the first gate electrode, the second gate electrode, and the isolation region extends on top of the shallow trench isolation region; and
a polymer region between the isolation region and the shallow trench isolation region.

5. The structure of claim 4, wherein the polymer region physically contacts both of the shallow trench isolation region and the isolation region.

6. The structure of claim 5, wherein the polymer region is inside a recess of the isolation region.

7. The structure of claim 1 further comprising a polymer region between the isolation region and the first gate spacer.

8. The structure of claim 1, wherein the dielectric layer comprises a high-k dielectric material.

9. The structure of claim 1, wherein both of the horizontal portion and the slanted portion are straight.

10. The structure of claim 1, wherein an inner angle formed between the horizontal portion and the slanted portion of the dielectric layer is an acute angle.

11. A structure comprise:
a first gate spacer, wherein the first gate spacer comprises an upper portion and a lower portion;
a second gate spacer parallel to the first gate spacer;
a first gate stack between the first gate spacer and the second gate spacer;
a second gate stack between the first gate spacer and the second gate spacer; and
a dielectric region between the first gate stack and the second gate stack, and between the first gate spacer and the second gate spacer, wherein the dielectric region comprises:
a high-k dielectric layer, wherein a portion of the high-k dielectric layer is in physical contact with the lower portion of the first gate spacer, and wherein the portion of the high-k dielectric layer in physical contact with the lower portion is overlapped and covered by the upper portion of the first gate spacer.

12. The structure of claim 11, wherein the first gate stack comprises a first gate dielectric, the second gate stack comprises a second gate dielectric, and the high-k dielectric layer, the first gate dielectric, and the second gate dielectric are formed of a same dielectric material.

13. The structure of claim 11, wherein an entirety of the portion of the high-k dielectric layer is covered by and directly underlying the upper portion of the first gate spacer.

14. The structure of claim 11, wherein the dielectric region is physically joined with the first gate stack, the second gate stack, the first gate spacer, and the second gate spacer.

15. The structure of claim 11, wherein the dielectric region further comprises an isolation region, wherein a portion of the isolation region extends directly under the upper portion of the first gate spacer.

16. The structure of claim 11 further comprising a shallow trench isolation region underlying the dielectric region, wherein the dielectric region extends into the shallow trench isolation region.

17. The structure of claim 16, wherein the high-k dielectric layer is higher than, and is in contact with a top surface of, the shallow trench isolation region.

18. A structure comprise:
a first gate spacer, wherein the first gate spacer comprises a first upper portion and a first lower portion;
a second gate spacer parallel to the first gate spacer;
a first gate stack between the first gate spacer and the second gate spacer;
a second gate stack between the first gate spacer and the second gate spacer;
an isolation region between the first gate stack and the second gate stack, and between the first gate spacer and the second gate spacer, wherein the first upper portion of the first gate spacer is in physical contact with a second upper portion of the isolation region; and
a dielectric layer between the first gate spacer and the isolation region, wherein the dielectric layer is in physical contact with the first lower portion of the first gate spacer and a second lower upper portion of the isolation region.

19. The structure of claim 18, wherein the isolation region and the dielectric layer are formed of different materials.

20. The structure of claim 18, wherein the dielectric layer is formed of a same material as gate dielectrics in the first gate stack and the second gate stack.

* * * * *